(12) United States Patent
Yu et al.

(10) Patent No.: US 11,955,552 B2
(45) Date of Patent: *Apr. 9, 2024

(54) SEMICONDUCTOR DEVICE WITH BACKSIDE POWER RAIL AND METHODS OF FABRICATION THEREOF

(71) Applicant: TAIWAN SEMICONDUCTOR MANUFACTURING COMPANY, LTD., Hsinchu (TW)

(72) Inventors: Li-Zhen Yu, New Taipei (TW); Huan-Chieh Su, Changhua (TW); Shih-Chuan Chiu, Hsinchu (TW); Lin-Yu Huang, Hsinchu (TW); Cheng-Chi Chuang, New Taipei (TW); Chih-Hao Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/985,991

(22) Filed: Nov. 14, 2022

(65) Prior Publication Data
US 2023/0075343 A1 Mar. 9, 2023

Related U.S. Application Data

(63) Continuation of application No. 17/081,915, filed on Oct. 27, 2020, now Pat. No. 11,502,201.

(51) Int. Cl.
*H01L 29/78* (2006.01)
*H01L 21/8238* (2006.01)
(Continued)

(52) U.S. Cl.
CPC .... *H01L 29/785* (2013.01); *H01L 21/823821* (2013.01); *H01L 27/0886* (2013.01);
(Continued)

(58) Field of Classification Search
CPC ............... H01L 29/785; H01L 29/4975; H01L 2029/7858; H01L 29/42392;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Changhyun Yi
(74) *Attorney, Agent, or Firm* — NZ CARR LAW OFFICE

(57) ABSTRACT

A semiconductor device structure includes a source/drain feature comprising a first surface, a second surface opposing the first surface, and a sidewall connecting the first surface to the second surface. The structure also includes a dielectric layer having a continuous surface in contact with the entire second surface of the source/drain feature, a semiconductor layer having a first surface, a second surface opposing the first surface, and a sidewall connecting the first surface to the second surface, wherein the sidewall of the semiconductor layer is in contact with the sidewall of the source/drain feature. The structure also includes a gate dielectric layer in contact with the continuous surface of the dielectric layer and the second surface of the semiconductor layer, and a gate electrode layer surrounding a portion of the semiconductor layer.

20 Claims, 40 Drawing Sheets

(51) Int. Cl.
*H01L 27/088* (2006.01)
*H01L 29/417* (2006.01)
*H01L 29/49* (2006.01)
*H01L 29/66* (2006.01)

(52) U.S. Cl.
CPC .... *H01L 29/41791* (2013.01); *H01L 29/4975* (2013.01); *H01L 29/66795* (2013.01); *H01L 2029/7858* (2013.01)

(58) Field of Classification Search
CPC ....... H01L 21/823821; H01L 29/41791; H01L 21/823425; H01L 21/823456; H01L 21/823418; H01L 21/845; H01L 27/0886; H01L 29/66795; H01L 21/823481; H01L 29/0673

See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,502,201 | B2 * | 11/2022 | Yu ..................... H01L 29/66795 |
| 2014/0151639 | A1 | 6/2014 | Chang et al. |
| 2017/0229555 | A1 * | 8/2017 | Balakrishnan ...... H01L 29/7853 |
| 2019/0181224 | A1 | 6/2019 | Zhang et al. |
| 2019/0181257 | A1 * | 6/2019 | Jeong ..................... H01L 29/785 |
| 2020/0091152 | A1 * | 3/2020 | Noh ..................... H01L 29/6681 |
| 2020/0118881 | A1 * | 4/2020 | Bi ........................ H01L 21/3065 |
| 2021/0066289 | A1 * | 3/2021 | Noh ..................... H01L 27/0886 |
| 2021/0217860 | A1 | 7/2021 | Ha et al. |

* cited by examiner

Fig. 28 (Alternative Embodiment)

Fig. 29 (Alternative Embodiment)

SEMICONDUCTOR DEVICE WITH BACKSIDE POWER RAIL AND METHODS OF FABRICATION THEREOF

CROSS-REFERENCE TO RELATED APPLICATIONS

This application is a continuation application of U.S. patent application Ser. No. 17/081,915 filed Oct. 27, 2020, which is incorporated by reference in its entirety.

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions also created new limiting factors. For example, loading effects of different etch processes may cause discrepancies between the processing of structures in different regions of a device, such as transistors in a short channel region and transistors in a long channel region, resulting in poor device performance.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
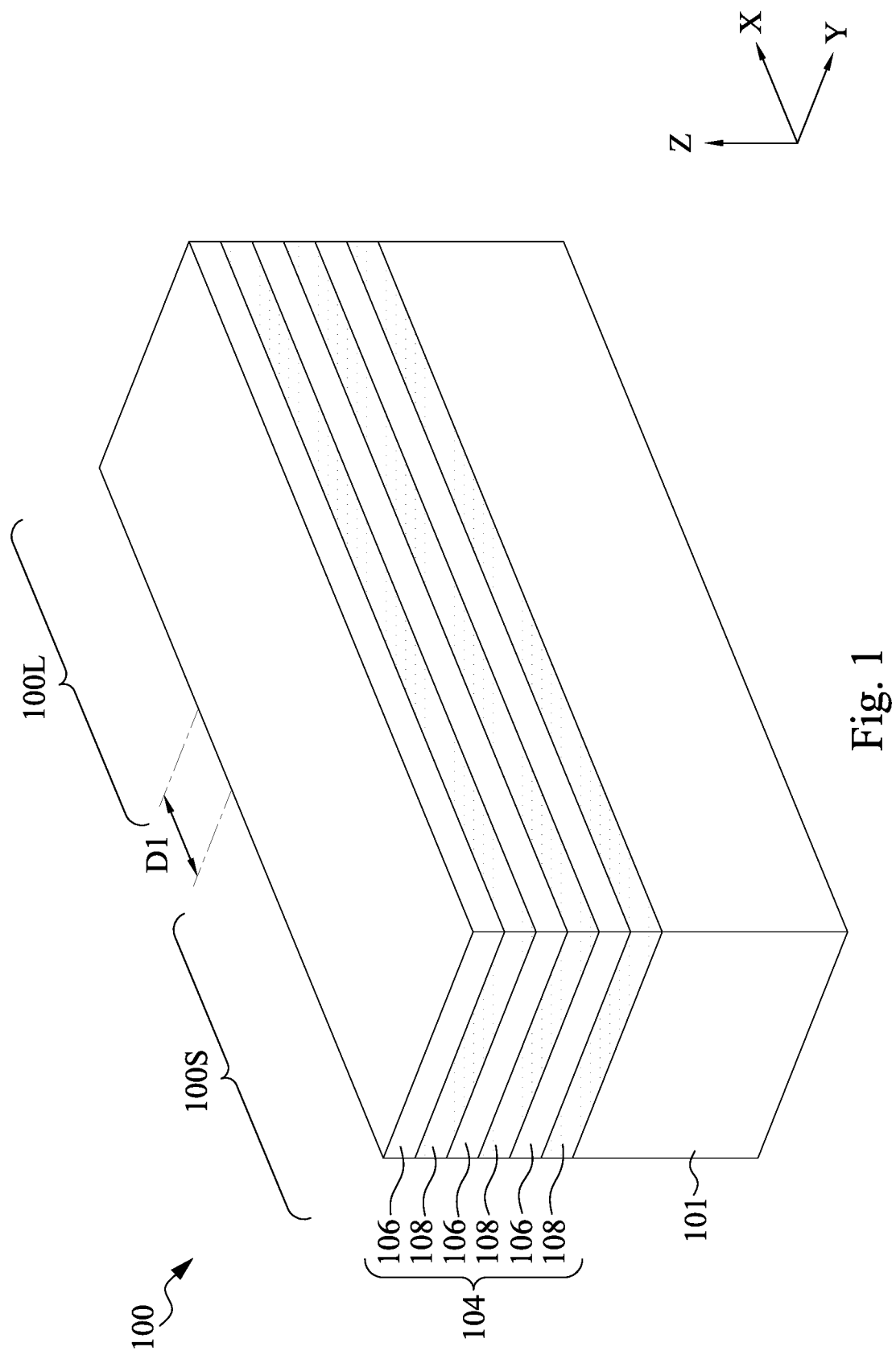
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor devices having metal contacts for connecting to power rails formed on a backside of a substrate, and methods for fabricating such semiconductor devices. When the power rails are formed on the backside of the substrate, metal layers in the back end of line (BEOL) may be manufactured using reduced number of masks with improved performance, width of gates in field-effector transistors (FETs) can be enlarged, and width of power rails can also be increased. Metal contacts on the backside and the backside power rail are formed by backside processes which are performed after completing BEOL processes and flipping the substrate over.

The current technologies of forming source/drain contacts often result in different depths of epitaxial features in a substrate. For example, drain epitaxial features in long channel regions may have a greater depth in the substrate than a depth of source epitaxial features in the short channel regions. This is because the short channel regions have a device layout density greater than that of the long channel regions, resulting in a greater amount of etchant consumed in the long channel regions than the amount of the etchant consumed in the short channel regions. In order to protect drain epitaxial features in the long channel regions from getting exposed and damaged during backside processing (e.g., during backside grinding of the silicon substrate), the backside contact contacting the source epitaxial features is made deeper into the silicon substrate, which increases contact resistance of the backside contact in the short channel regions and thus degraded device performance of the transistors. According to embodiments of the present disclosure, a portion of the drain epitaxial features in the long channel regions is recessed to the level of the bottom of the silicon substrate (over even to the level of the bottom of the gate dielectric layers) during backside grinding of the silicon substrate. The drain epitaxial features in the long channel regions are then covered by a dielectric layer. When the drain epitaxial features have reduced depth in the substrate, the backside contact at source regions of the short channel region can be made shorter. As a result, the contact resistance at source epitaxial features of the short channel regions is reduced and the device performance of the transistors is improved. Various embodiments are discussed in more detail below.

While the embodiments of this disclosure are discussed with respect to the backside power rails, it is contemplated that various embodiments of this disclosure are equally applicable to semiconductor devices having power rails formed on the front side of the substrate. In addition, although some embodiments described in this disclosure are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-41 show exemplary processes for manufacturing a semiconductor device structure 100 according to embodiments of the present disclosure. It is understood that additional operations can be provided before, during, and after processes shown by FIGS. 1-41, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. The semiconductor device structure 100 may represent a portion of a larger IC structure and can include short channel regions 100S (only one is shown) and long channel regions 100L (only one is shown) at respective portions of the semiconductor device structure 100. The short channel region 100S and the long channel region 100L may be separated from each other by a distance "D1", which may be any suitable distance depending on the application. While the short channel region 100S is shown adjacent to the long channel region 100L along the X direction, the long channel region 100L may be located at different regions of the substrate 101.

The semiconductor device structure 100 can be structured to include a plurality of so-called short channel devices and a plurality of so-called long channel devices. The channel length of the long channel devices is typically greater than the channel length of the short channel devices. The transistors to be formed in the short channel region 100S are considered as short channel devices while the transistors to be formed in the long channel region 100L are considered as long channel devices. Short channel devices typically have a threshold voltage that is less than the threshold voltage of long channel devices. In general, the short channel devices exhibit faster switching speeds and higher off-state leakage currents. Short channel devices are often employed in portions of an integrated circuit where fast switching speeds of the transistors is desired, e.g., the logic or computational circuits in an integrated circuit product, a section of the IC product where the switching speed of the transistors is more important than controlling the off-state leakage current of such transistors. In contrast, long channel devices are employed as circuit elements in circuits where the switching speed of the transistors is less desired than their ability to exhibit low off-state leakage currents. For example, long channel devices may be employed in input/output circuits so as to reduce power consumption when the integrated circuit product is turned off.

The semiconductor device structure 100 includes a substrate 101 which may include any currently-known or later developed material capable of being processed into a transistor device. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (e.g., oxide) disposed between two silicon layers for enhancement.

The substrate 101 may include various regions that have been doped with impurities (e.g., dopants having p-type or n-type conductivity). Depending on circuit design, the dopants may be, for example boron for an n-type field effect transistors (NFET) and phosphorus for a p-type field effect transistors (PFET).

A stack of semiconductor layers 104 is formed over the substrate 101. The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by the gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

As will be described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm. It should be understood that each first semiconductor layer 106 and each second semiconductor layer 108 in the stack 104 need not be formed to the same thickness, although that may be the case in some applications.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

Figure 2:
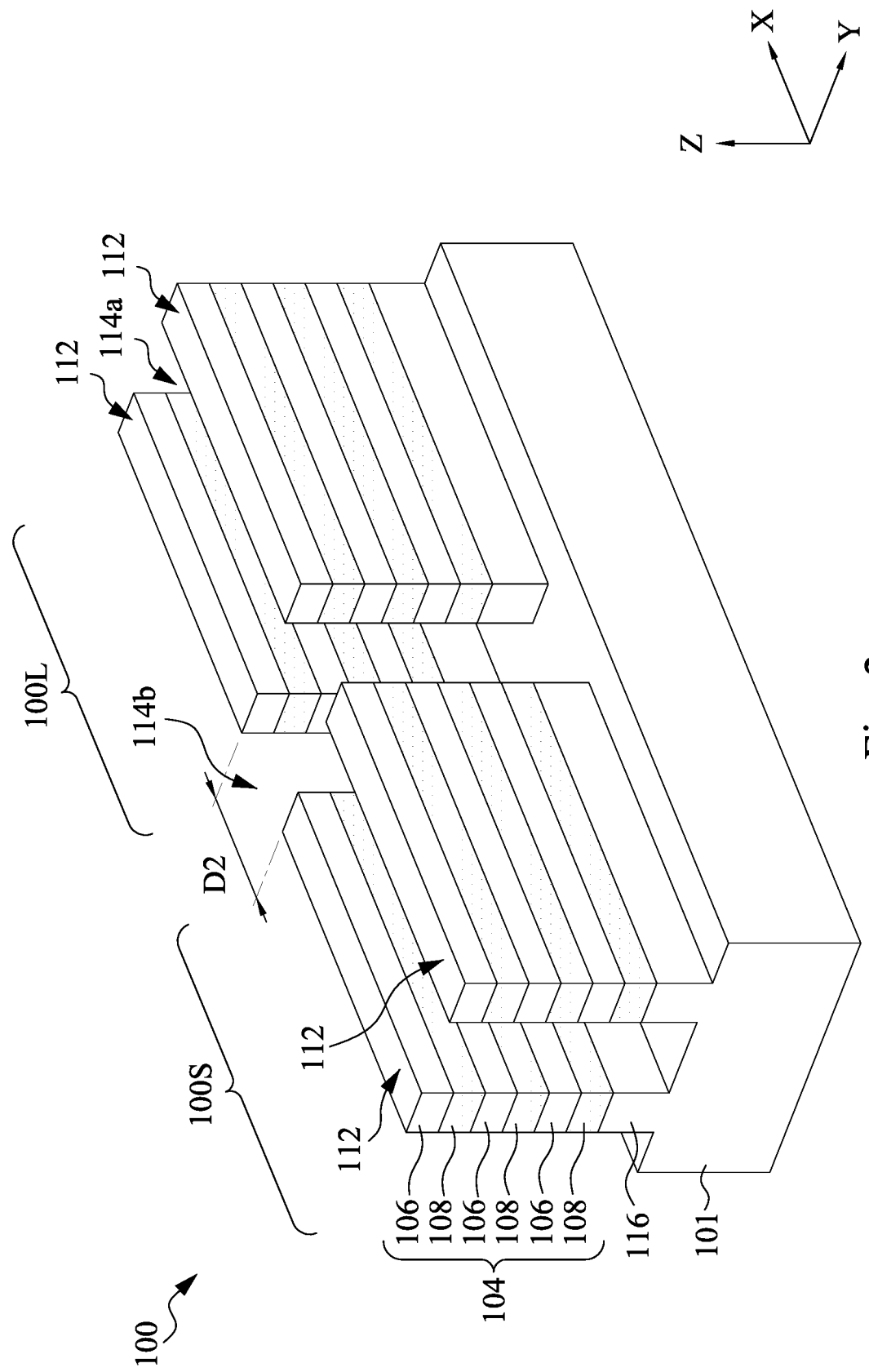

In FIG. 2, fins 112 are formed from the stack of semiconductor layers 104 and a portion of the substrate 101 in the short channel regions 100S and the long channel regions 100L. Each fin 112 has an upper portion including the semiconductor layers 106, 108 and a well portion 116 formed from the substrate 101. The fins 112 may be formed by patterning a hard mask layer (not shown) formed on the stack of semiconductor layers 104 using patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114a and 114b in unprotected regions through the hard mask layer, through the stack of semiconductor layers 104, and into the substrate 101, thereby leaving the plurality of extending fins 112. The trench 114a extends along the X direction while the trench 114b extends along the Y direction. The trench 114b has a width "D2" that substantially corresponds to the distance "D1" shown in FIG. 1. The fins 112 in the short channel regions 100S are separated from the fins 112 in the long channel regions 100L by the distance "D2". The trenches 114a and 114b may be etched using a dry etch (e.g., RIE), a wet etch, and/or combination thereof.

Figure 3:
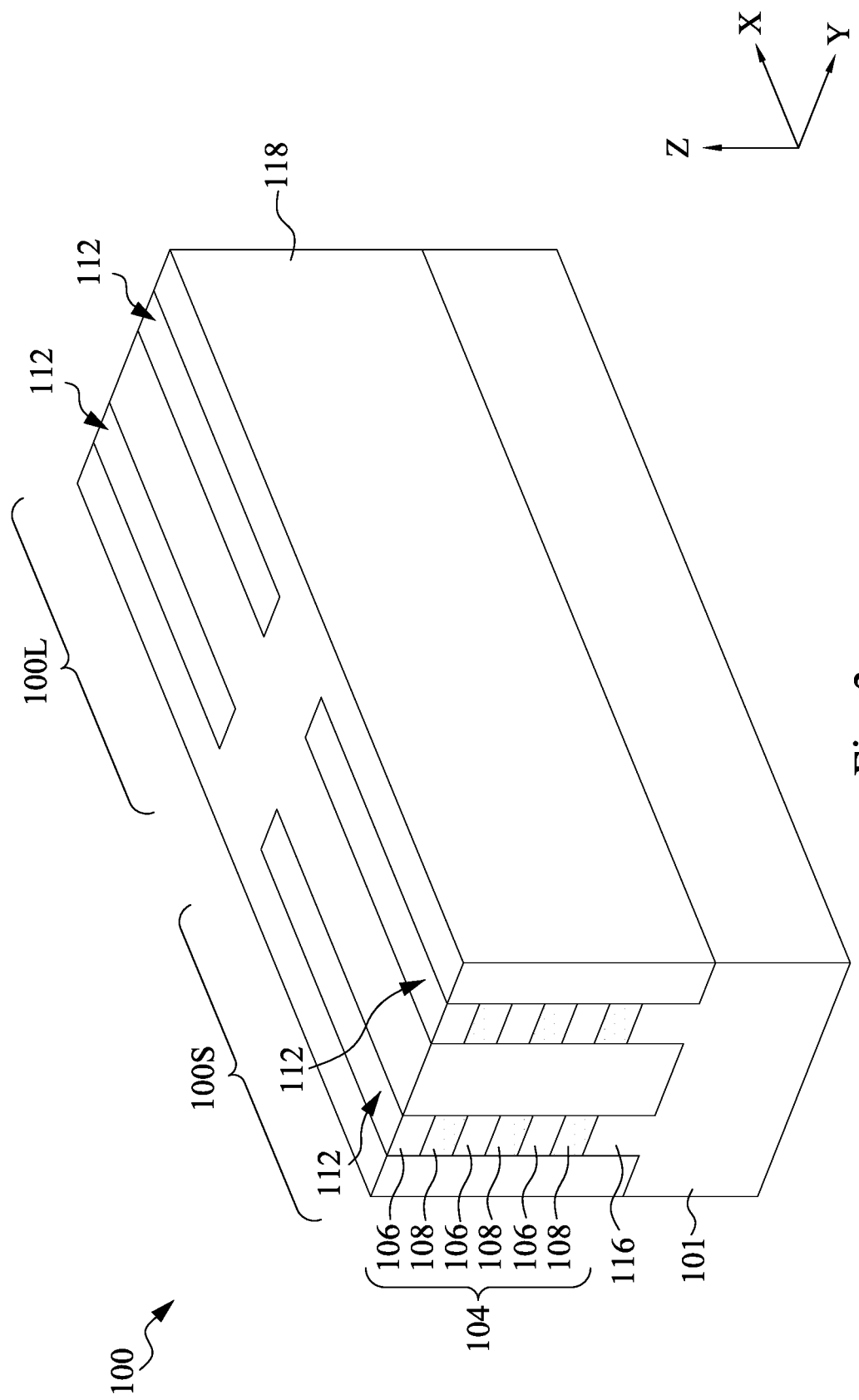

In FIG. 3, after the fins 112 are formed, an insulating material 118 is formed in the trenches 114a and 114b so that the fins 112 in the short channel regions 100S and the long channel regions 100L are embedded in the insulating material 118. Then, a planarization operation, such as a chemical mechanical polishing (CMP) method and/or an etch-back method, is performed such that the top of the fins 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
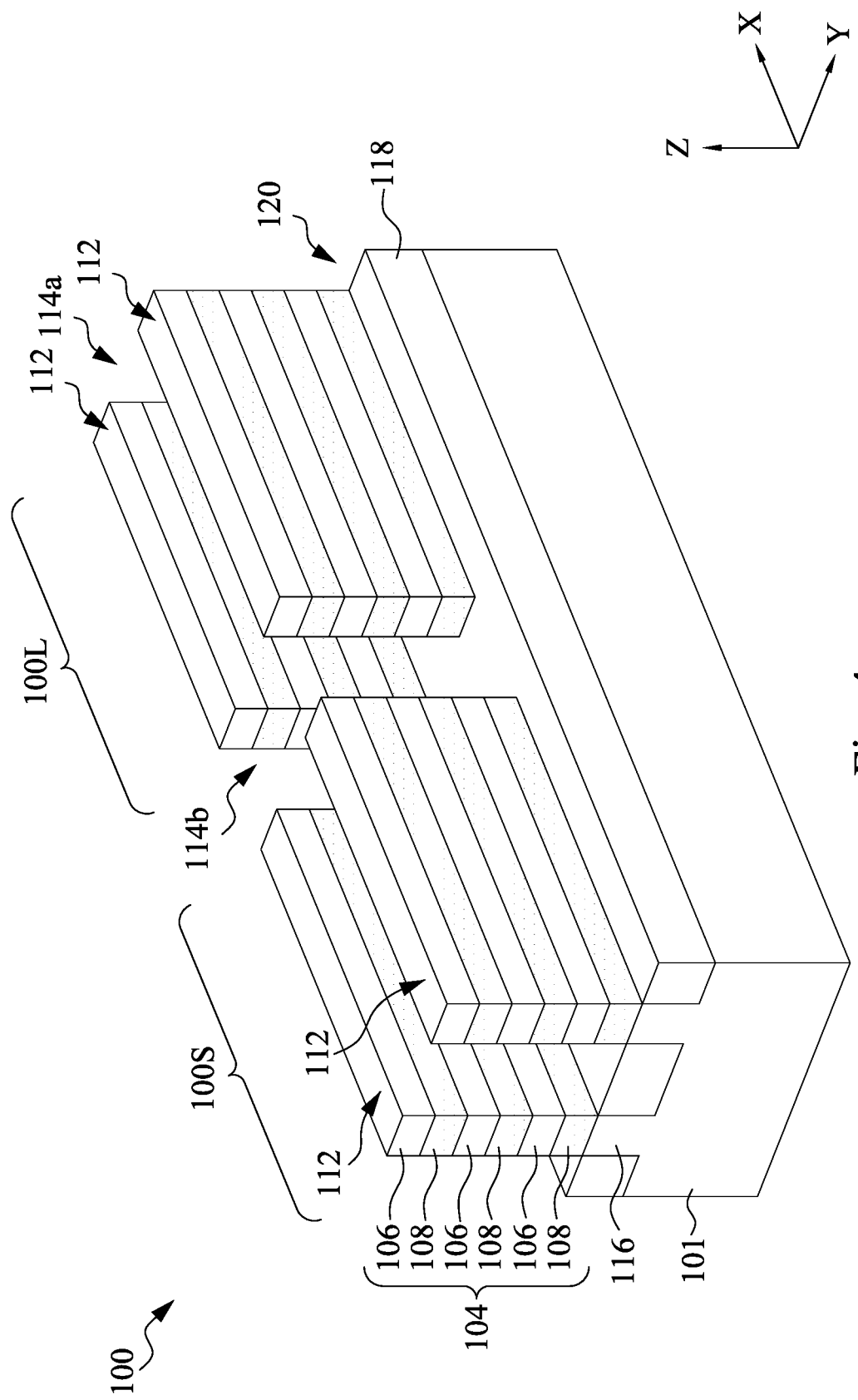

In FIG. 4, the insulating material 118 is recessed to form an isolation region 120. The recess of the insulating material 118 exposes portions of the fins 112, such as the stack of semiconductor layer 104, in the short channel regions 100S and the long channel regions 100L. The recess of the insulating material 118 results in the trenches 114a and 114b between the neighboring fins 112. The isolation region 120 may be formed using a suitable a dry etching process, a wet etching process, or a combination thereof. A top surface of the insulating material 118 may be level with or below a surface of the second semiconductor layers 108 in contact with the well portion 116 formed from the substrate 101.

Figure 5:
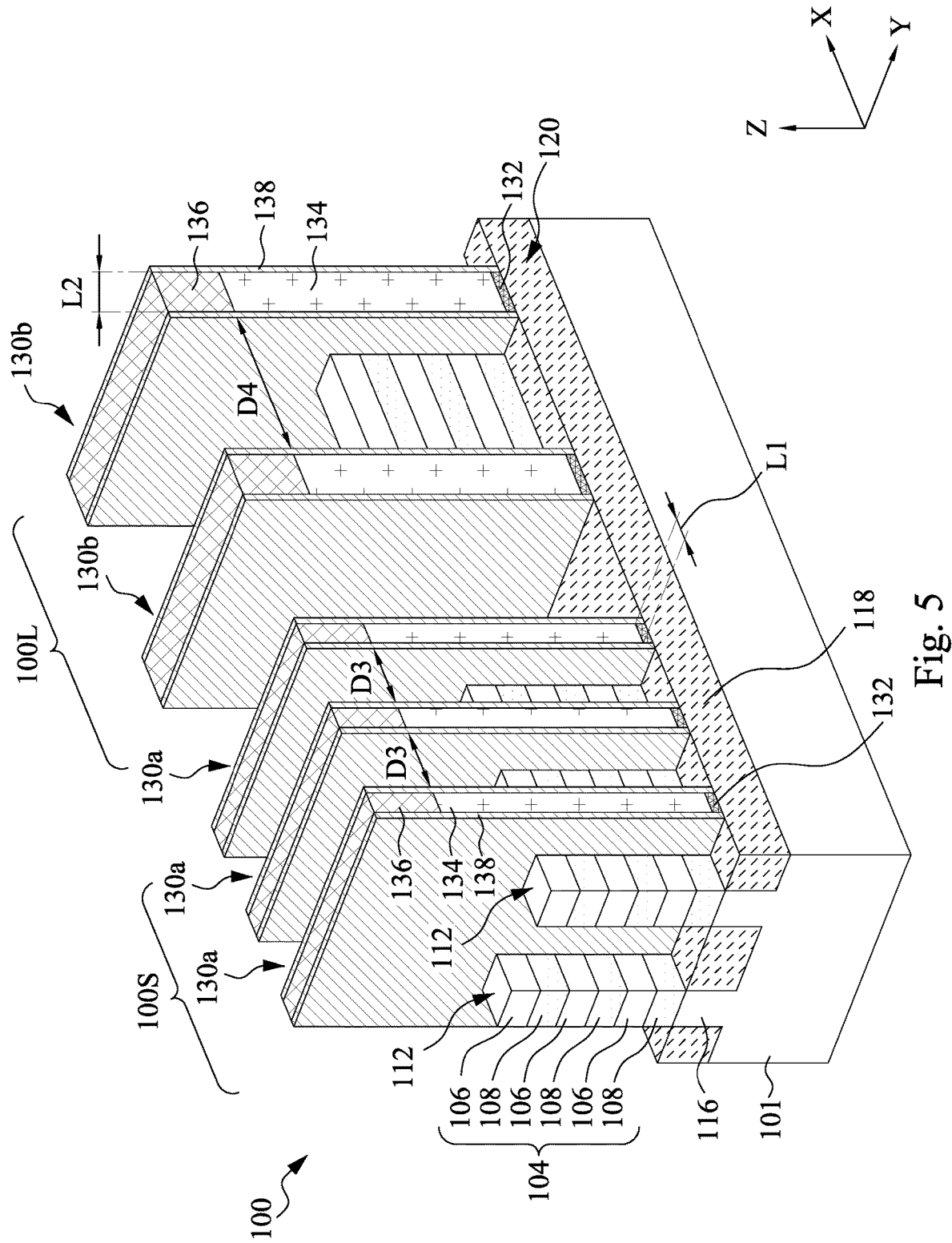

In FIG. 5, sacrificial gate structures 130a, 130b are formed over the semiconductor device structure 100. The sacrificial gate structures 130a and 130b are formed over a portion of the fins 112 in the short channel regions 100S and the long channel regions 100L, respectively. Each sacrificial gate structure 130a, 130b may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially forming respective layers, and then patterning those layers into the sacrificial gate structure 130. Gate spacers 138 are then formed on sidewalls of the sacrificial gate structures 130a, 130b. The gate spacers 138 may be formed by conformally depositing one or more layers for the gate spacers 138 and anisotropically etching the one or more layers, for example.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fins 112 in the short channel region 100S that are covered by the sacrificial gate electrode layer 134 (to be replaced with a gate electrode layer 172 shown in FIG. 20) of the sacrificial gate structure 130a serve as channel regions for the short channel devices. Likewise, the portions of the fins 112 in the long channel region 100L that are covered by the sacrificial gate electrode layer 134 (to be replaced with gate electrode layer 172 shown in FIG. 20) of the sacrificial gate structure 130b serve as channel regions for the long channel devices.

The fins 112 that are partially exposed on opposite sides of each sacrificial gate structures 130a, 130b define source/drain (S/D) regions for the semiconductor device structure 100. In some cases, some S/D regions may be shared between various transistors. For example, various one of the S/D regions in the short channel region 100S may be connected together and implemented as multiple functional transistors. Likewise, various one of the S/D regions in the long channel region 100L may be connected together and implemented as multiple functional transistors. For exemplary illustration purposes, the region 115a (FIG. 7) between the sacrificial gate structures 130a in the short channel region 100S is designated as a source region/terminal, while the region 115b (FIG. 7) between the sacrificial gate structures 130a in the short channel region 100S is designated as a drain region/terminal. The region 115c (FIG. 7) between the sacrificial gate structures 130b in the long channel region 100L is designated as a drain region/terminal. However, it should be understood that the source region and the drain region can be interchangeably used since the epitaxial features to be formed in these regions are substantially the same.

Each sacrificial gate structure 130a in the short channel regions 100S is formed to have a first gate length L1, which is defined by the length of the sacrificial gate electrode layer 134 along the X direction in the short channel regions 100S. Each sacrificial gate structure 130b in the long channel regions 100L is formed to have a second gate length L2, which is defined by the length of the sacrificial gate electrode layer 134 along the X direction in the long channel regions 100L. The second gate length L2 is greater than the first gate length L1. Depending on the application and the size of the sacrificial gate structures 130a, 130b, the second gate length L2 can be equal to or greater than about 40 nm, for example greater than about 80 nm, and the first gate length L1 can be equal to or less than about 20 nm, for example less than about 15 nm. In general, a lateral separation distance "D3" between adjacent sacrificial gate structures 130a in the short channel regions 100S is less than a lateral separation distance "D4" between adjacent sacrificial gate structures 130b in the long channel regions 100L.

It should be noted that each sacrificial gate structure 130a in the short channel regions 100S and each sacrificial gate structure 130b in the long channel regions 100L need not be formed to have the same gate length. The gate lengths discussed herein are equally applicable to the gate electrode layer 172 of the gate structure 174a to be discussed below with respect to FIG. 20. In addition, while three sacrificial gate structures 130a and two sacrificial gate structures 130b are shown in the short channel regions 100S and the long channel regions 100L, respectively, the number of the sacrificial gate structure should not be limited. The short channel regions 100S and the long channel regions 100L may each include any desired number of the sacrificial gate structures in the X direction in some embodiments.

Figure 6:
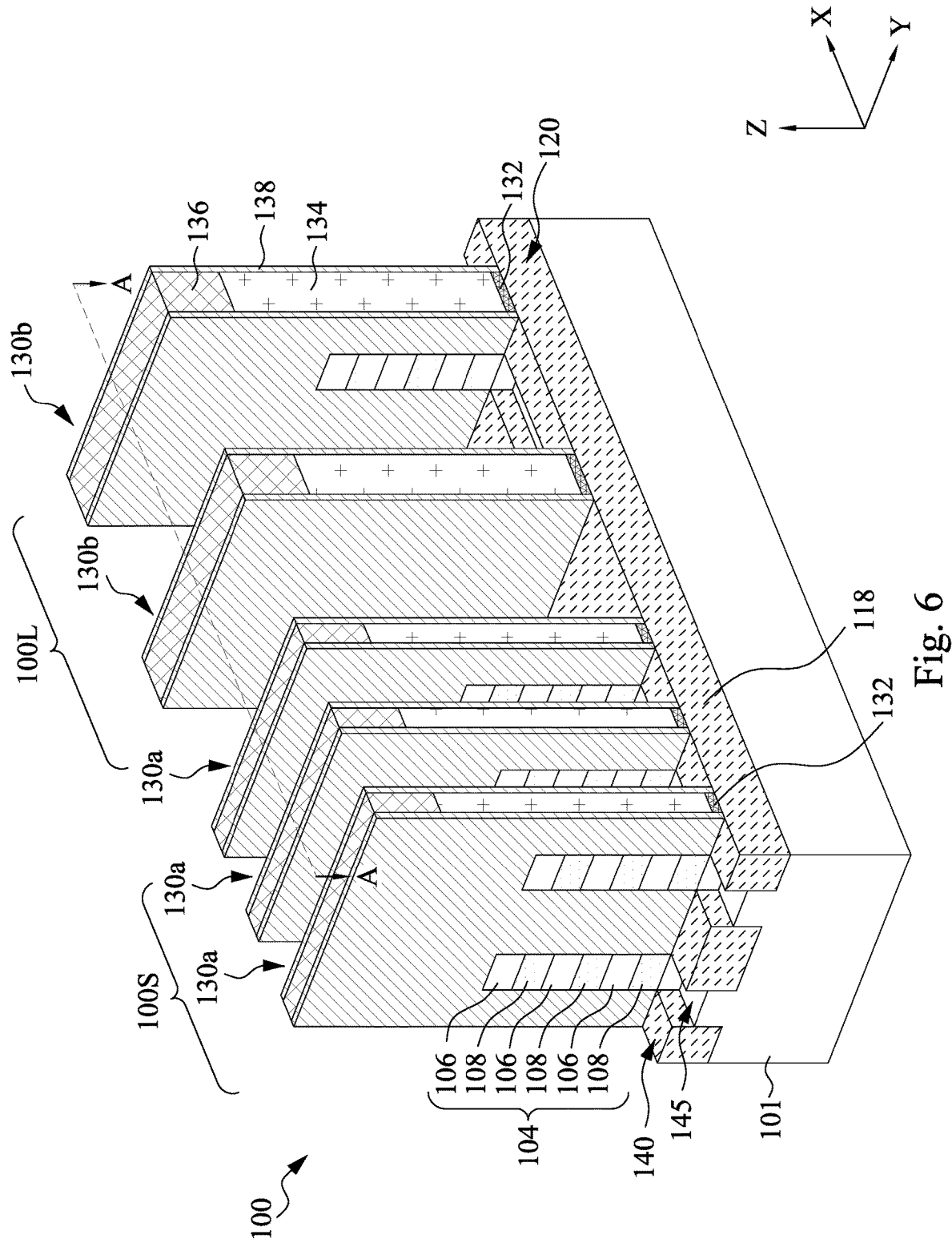

In FIG. 6, the portions of the fins 112 in the S/D regions (e.g., regions on opposite sides of the sacrificial gate structure 130) are recessed down below the top surface 140 of the isolation region 120 (or the insulating material 118), by removing portions of the fins 112 not covered by the sacrificial gate structures 130a, 130b. The recess of the portions of the fins 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethylammonium hydroxide (TMAH), ammonium hydroxide (NH4OH), or any suitable etchant. Trenches 119a, 119b (FIG. 7) are formed in the S/D regions as the result of the recess of the portions of the fins 112.

Figure 7:
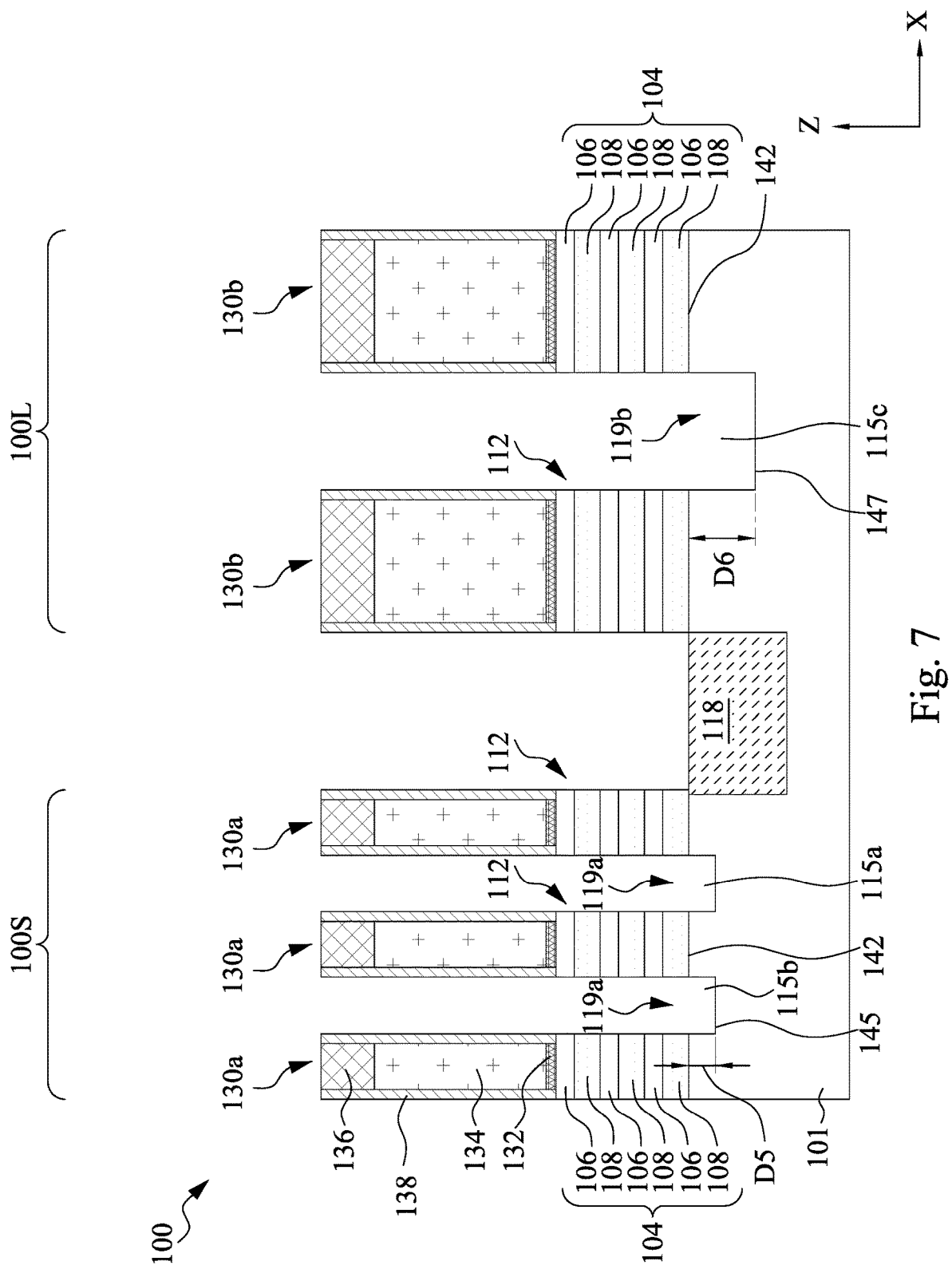
FIGS. 7-21 are cross-sectional side views of the various stages of manufacturing the semiconductor device structure of FIG. 6 taken along line A-A.

FIG. 7 is a cross-sectional side view of the semiconductor device structure 100 of FIG. 6 taken along line A-A. As can be seen, the trenches 119a at the source/drain regions of the short channel region 100S have a depth "D5", which is a distance measuring from an interface surface 142 between the second semiconductor layer 108 and the substrate 101 under the sacrificial gate structure 130a to the bottom 145 of the trenches 119a. The trenches 119b at the source/drain regions of the long channel region 100L have a depth "D6", which is a distance measuring from the interface surface 142 to the bottom 147 of the trenches 119b. The depth "D6" is greater than the depth "D5" due to loading effects of different etch processes between the short channel region 100S and the long channel region 100L. In one embodiment, the depth "D5" may be in a range between 10 nm and 30 nm, and the depth "D6" may be in a range between 40 nm and 60 nm.

Figure 8:
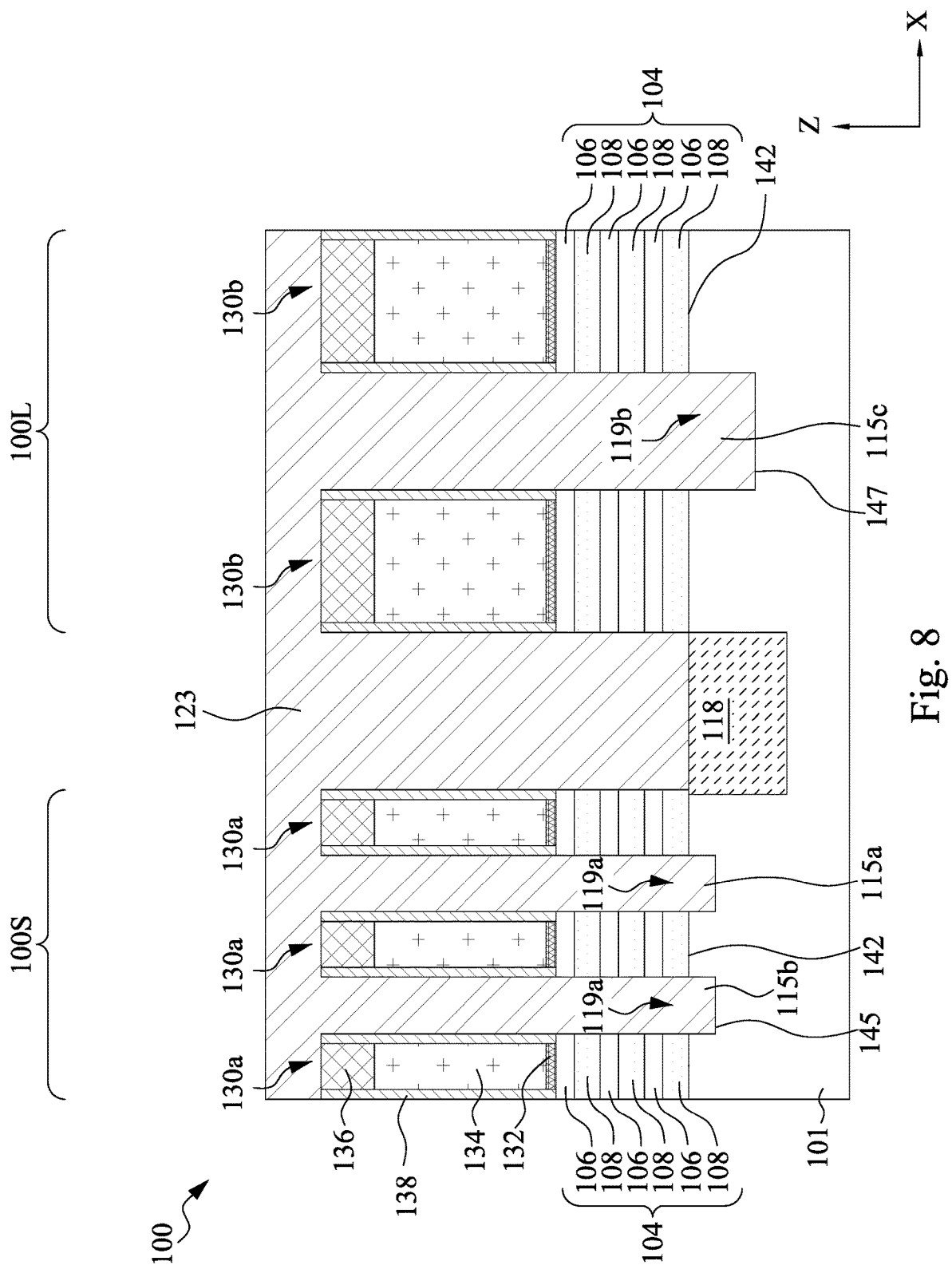

In FIG. 8, a coating layer is disposed on the semiconductor device structure 100. The coating layer 123 may be a multi-layer resist, such as a tri-layer resist layer including a bottom layer, a middle layer formed over the bottom layer, and a photoresist layer formed over the middle layer. The bottom layer may be a bottom anti-reflective coating (BARC) layer that fills in the trenches 119a and 119b and above the sacrificial gate structures 130a, 130b to a predetermined height. The bottom layer also fills the trench formed between the sacrificial gate structure 130a in the short channel region 100S and the sacrificial gate structure 130b in the long channel region 100L. The bottom layer may include or be a carbon backbone polymer or a silicon-free material formed by a spin-on coating process, a CVD process, a FCVD process, or any suitable deposition technique. The middle layer may be a composition that provides anti-reflective properties and/or hard mask properties for a photolithography process. The middle layer provides etching selectivity from the bottom layer and the photoresist layer. The middle layer may include or be amorphous silicon, silicon carbide, silicon nitride, silicon oxynitride, silicon oxide, a silicon-containing inorganic polymer, or any combination thereof. The photoresist layer may include or be a DUV resist (KrF) resist, an argon fluoride (ArF) resist, an EUV resist, an electron beam (e-beam) resist, or an ion beam resist.

Figure 9:
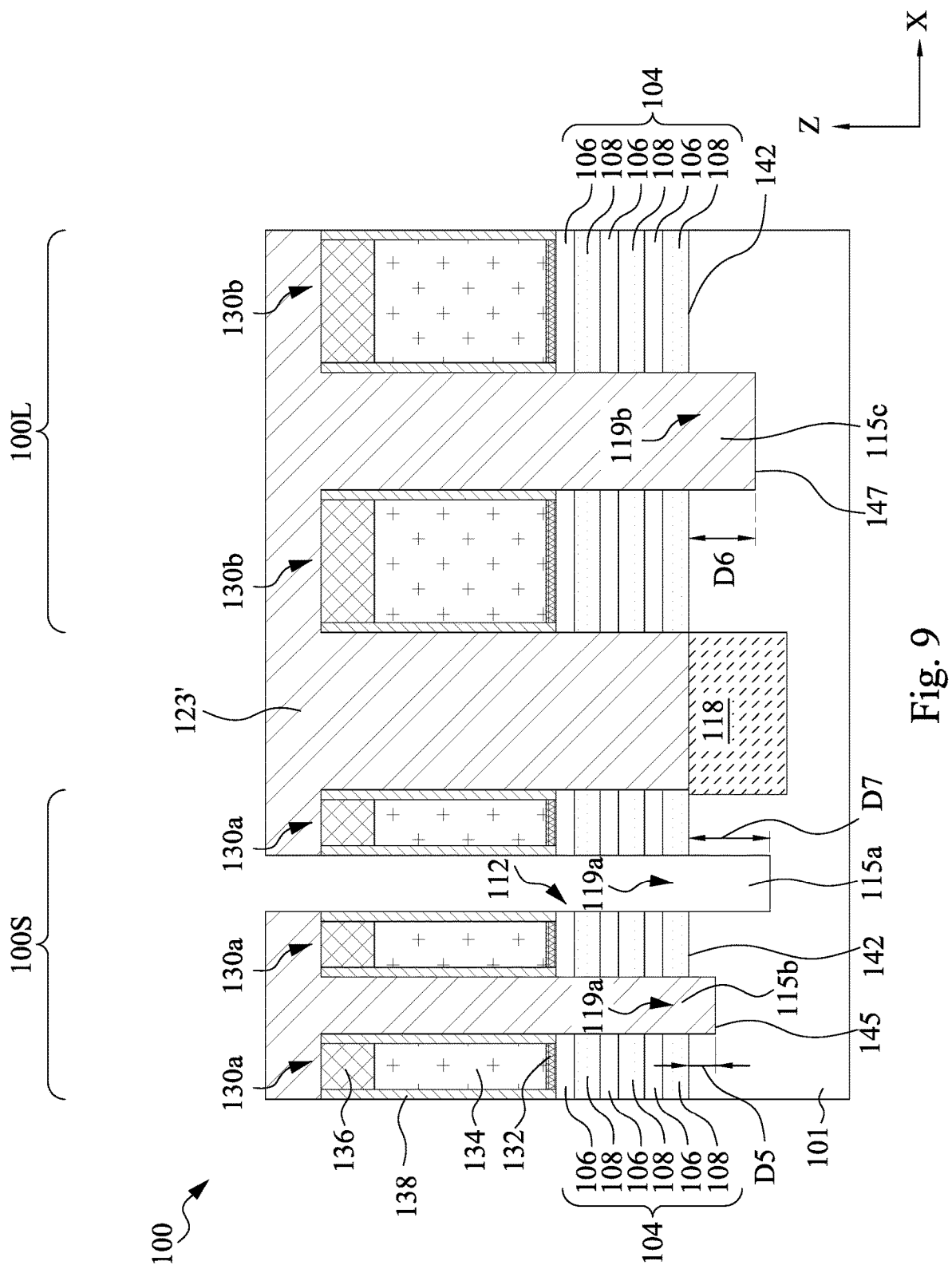

In FIG. 9, portions of the bottom layer, the middle layer, and the photoresist layer are removed by one or more photolithographic processes to form patterned coating layer 123'. An etch process, such as the etch process discussed above with respect to FIG. 6, can be performed to remove at least a portion of the substrate 101 at the source region 115a, using the patterned coating layer 123' as a mask. The source region 115a between the sacrificial gate structures 130a is hence further recessed after the source side etch process. The trench 119a at the source region 115a has a depth "D7", which is distance measuring from the interface surface 142 between the second semiconductor layer 108 and the substrate 101 under the sacrificial gate structure 130a to the bottom of the trench 119a. The depth "D7" is greater than the depth "D6", which is greater than the depth "D5".

Figure 10:
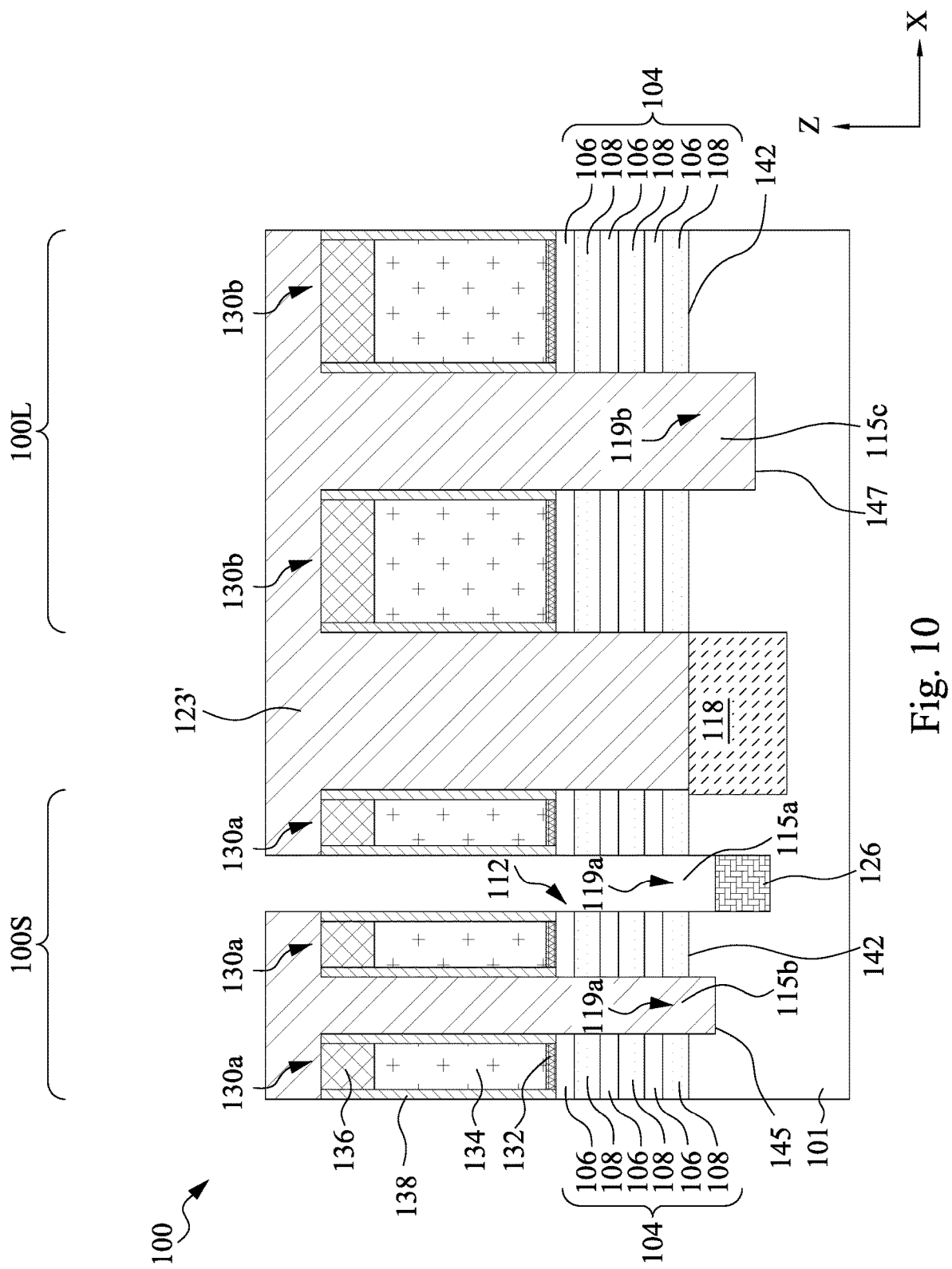

In FIG. 10, a sacrificial layer 126 (or so-called backside contact alignment feature) is selectively formed on the bottom of the trench 119a at the source region 115a, where epitaxial S/D feature formed therein is to be connected to a backside power rail. The patterned coating layer 123' prevents the sacrificial layer 126 to be formed thereon because the sacrificial layer 126 forms on a semiconductor material, such as the substrate 101, but not on the photoresist, which is the top layer of the patterned coating layer 123'. The sacrificial layer 126 is formed by CVD, CVD epitaxy, molecular beam epitaxy (MBE), or any suitable deposition technique. The sacrificial layer 126 will be selectively removed to form a backside contact hole in the substrate 101 at a later stage.

The material of the sacrificial layer 126 is chosen such that the sacrificial layer 126 has a different etch selectivity with respect to the material of the substrate 101 and the insulating material in the isolation region 120. In various embodiments, the sacrificial layer 126 may be a silicon germanium (SiGe) layer. The SiGe layer may be a single crystal SiGe layer, a graded SiGe layer where a germanium concentration varies with the distance from the interface of the graded SiGe layer with the exposed substrate 101, or a non-graded SiGe where a germanium concentration does not vary with the distance from the interface of the non-graded SiGe layer with the exposed substrate. In some cases, the SiGe layer can have a germanium composition percentage between about 50% and 95%.

After the sacrificial layer 126 is formed, the patterned coating layer 123' is removed using any suitable technique such as ashing, stripping, or the like.

Figure 11:
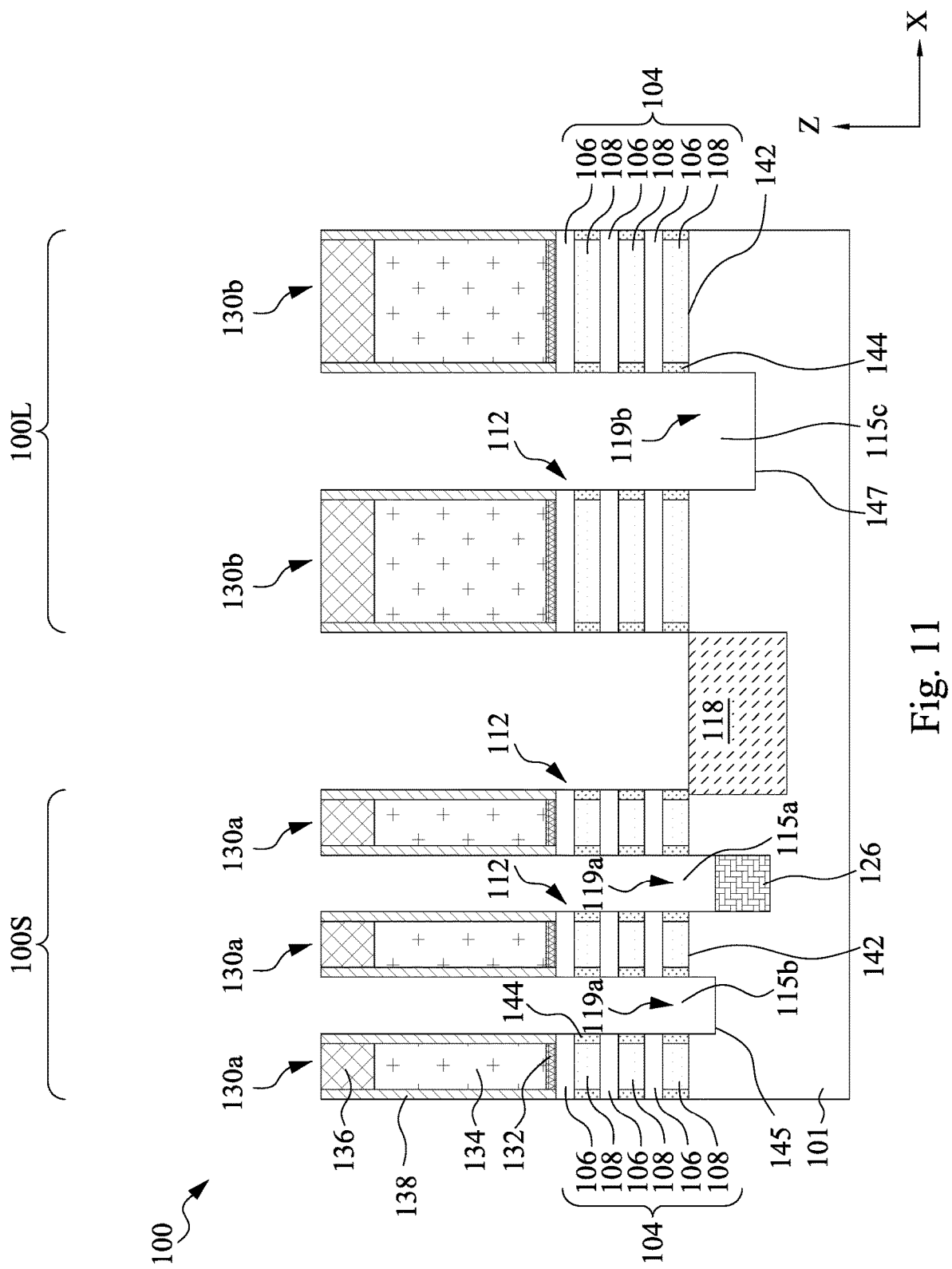

In FIG. 11, edge portions of each second semiconductor layer 108 of the stack of semiconductor layers 104 in the short channel region 100S and long channel region 100L are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer (or so-called inner spacer) is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 12:
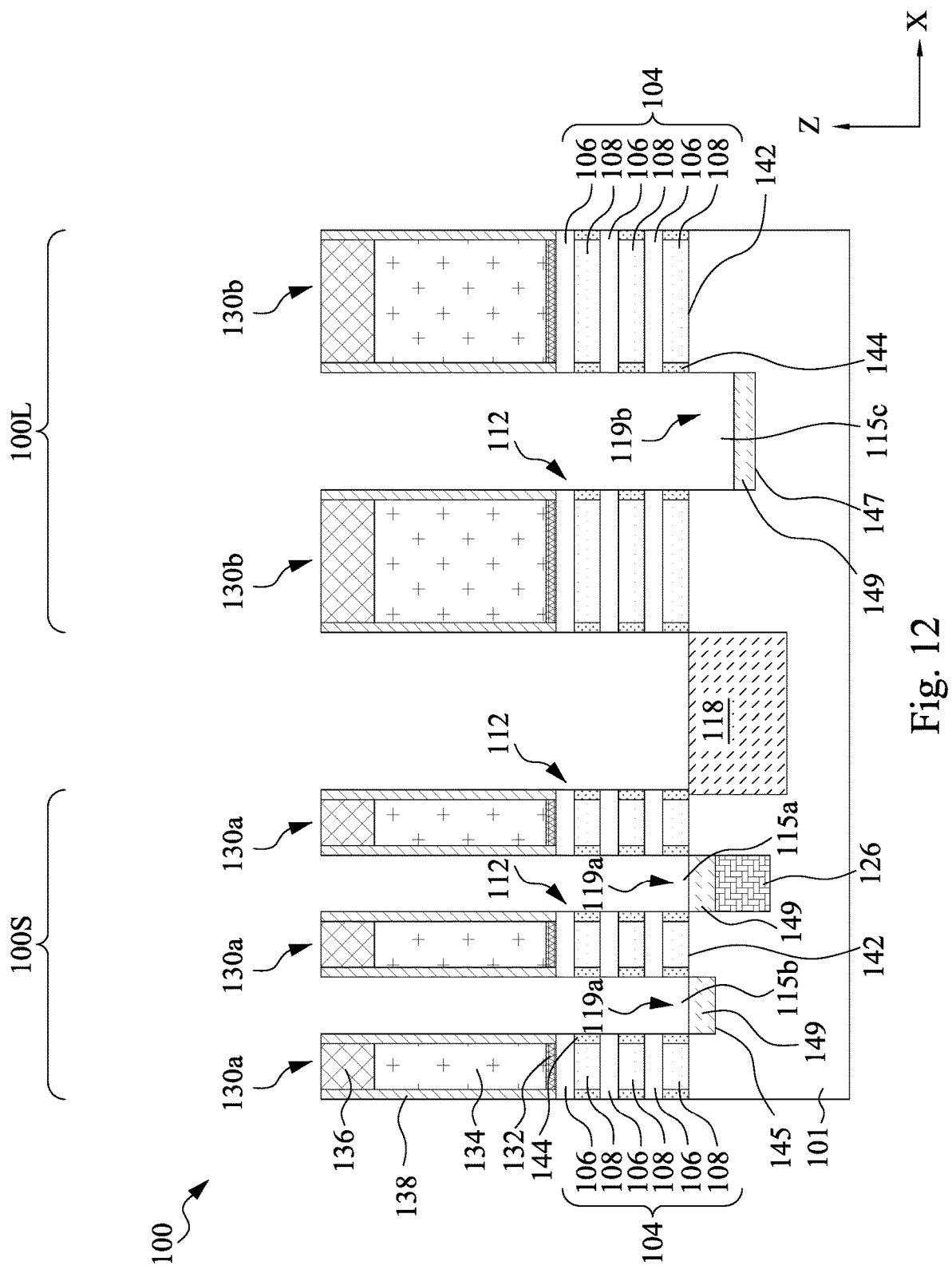

In FIG. 12, a transitional epitaxial layer 149 is formed in the trenches 119a, 119b. The transitional epitaxial layer 149 may grow epitaxially from the exposed surface of the sacrificial layer 126 at the source region 115a and the exposed surface of the substrate 101 at the drain region 115b. The transitional epitaxial layer 149 may also grow epitaxially from the exposed surfaces of the substrate 101 at the drain region 115c. The transitional epitaxial layer 149 functions to provide a bridge of lattice structures between the existing semiconductor features, such as the sacrificial layer 126 or the remaining portion of the substrate 101, and the epitaxial S/D feature to be formed in the source/drain regions 115a, 115b, 115c. In some embodiments, the transitional epitaxial layer 149 is formed from Si, SiGe, SiGeB, SiP, SiAs, and other silicon related epitaxial materials.

In some embodiments, material of the transitional epitaxial layer 149 is selected to have different etch and/or oxidation rate relative to the material of the substrate 101 and the sacrificial layer 126. In one example, the transitional epitaxial layer 149 is formed from SiGeB when the sacrificial layer 126 is formed from SiGe.

The transitional epitaxial layer 149 may be grown to fill the trenches 119a in the short channel region 100S along the Z direction to the level of the interface surface 142 between the second semiconductor layer 108 and the substrate 101 under the sacrificial gate structure 130a. The transitional epitaxial layer 149 may also be grown to fill the trenches 119b in the long channel region 100L along the Z direction. The height of the transitional epitaxial layer 149 in the short channel region 100S substantially equals to the height of the transitional epitaxial layer 149 in the long channel region 100L.

Figure 13:
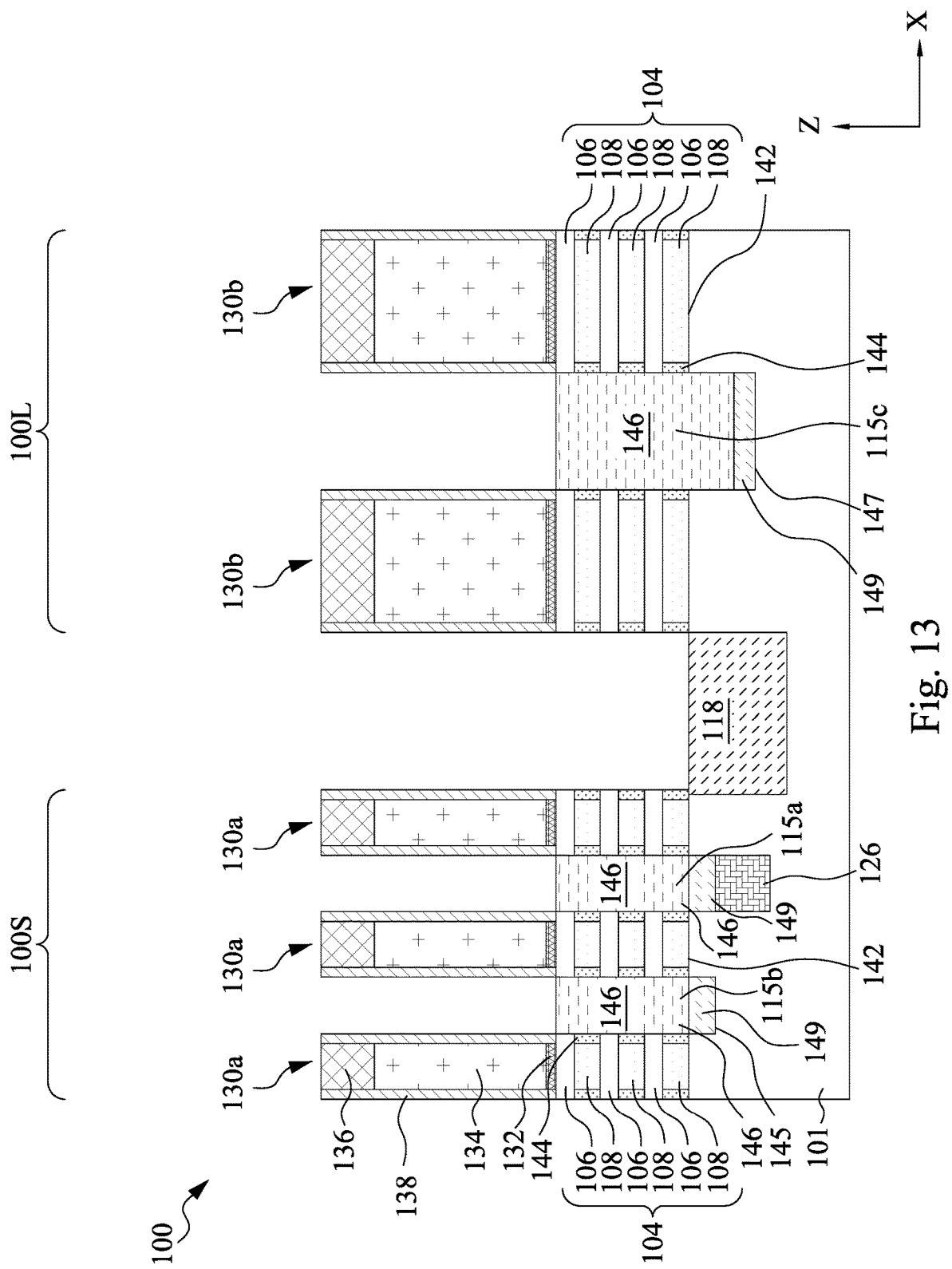

In FIG. 13, epitaxial S/D features 146 are formed in the source/drain (S/D) regions (e.g., source region 115a and drain region 115b, 115c). The epitaxial S/D features 146 may be made of one or more layers of Si, SiP, SiC and SiCP for n-channel FETs or Si, SiGe, Ge for p-channel FETs. For p-channel FETs, p-type dopants, such as boron (B), may also be included in the epitaxial S/D features 146.

In one example shown in FIG. 13, one of a pair of epitaxial S/D features 146 disposed over the source region 115a on one side of the sacrificial gate structure 130a is designated as a source feature/terminal, and the other of the pair of epitaxial S/D features 146 located on the other side of the sacrificial gate structure 130a is designated as a drain feature/terminal. The source feature/terminal and the drain feature/terminal in the short channel region 100S are connected by the channels (e.g., the first semiconductor layers 106). Likewise, one of a pair of epitaxial S/D features 146 disposed over the source region (not shown) on one side of the sacrificial gate structure 130b is designated as a source feature/terminal, and the other of the pair of epitaxial S/D features 146 disposed over the drain region 115c on the other side of the sacrificial gate structure 130b is designated as a drain feature/terminal. The source feature/terminal (not shown) and the drain feature/terminal in the long channel region 100L are connected by the channels (e.g., the first semiconductor layers 106). The source feature/terminal at the source region 115a is to be connected to a power rail from the backside of the substrate 101. The drain feature/terminal disposed at the drain region 115b may be connected to signal lines formed in a front side interconnect structure.

The epitaxial S/D features 146 are in contact with the first semiconductor layer 106 under the sacrificial gate structures 130a, 130b. In some cases, the epitaxial S/D features 146 may grow pass the topmost semiconductor channel, i.e., the first semiconductor layer 106 under the sacrificial gate structure 130a, 130b, to be in contact with the gate spacers 138. The second semiconductor layer 108 under the sacrificial gate structure 130a, 130b are separated from the epitaxial S/D features 146 by the dielectric spacers 144.

Figure 14:
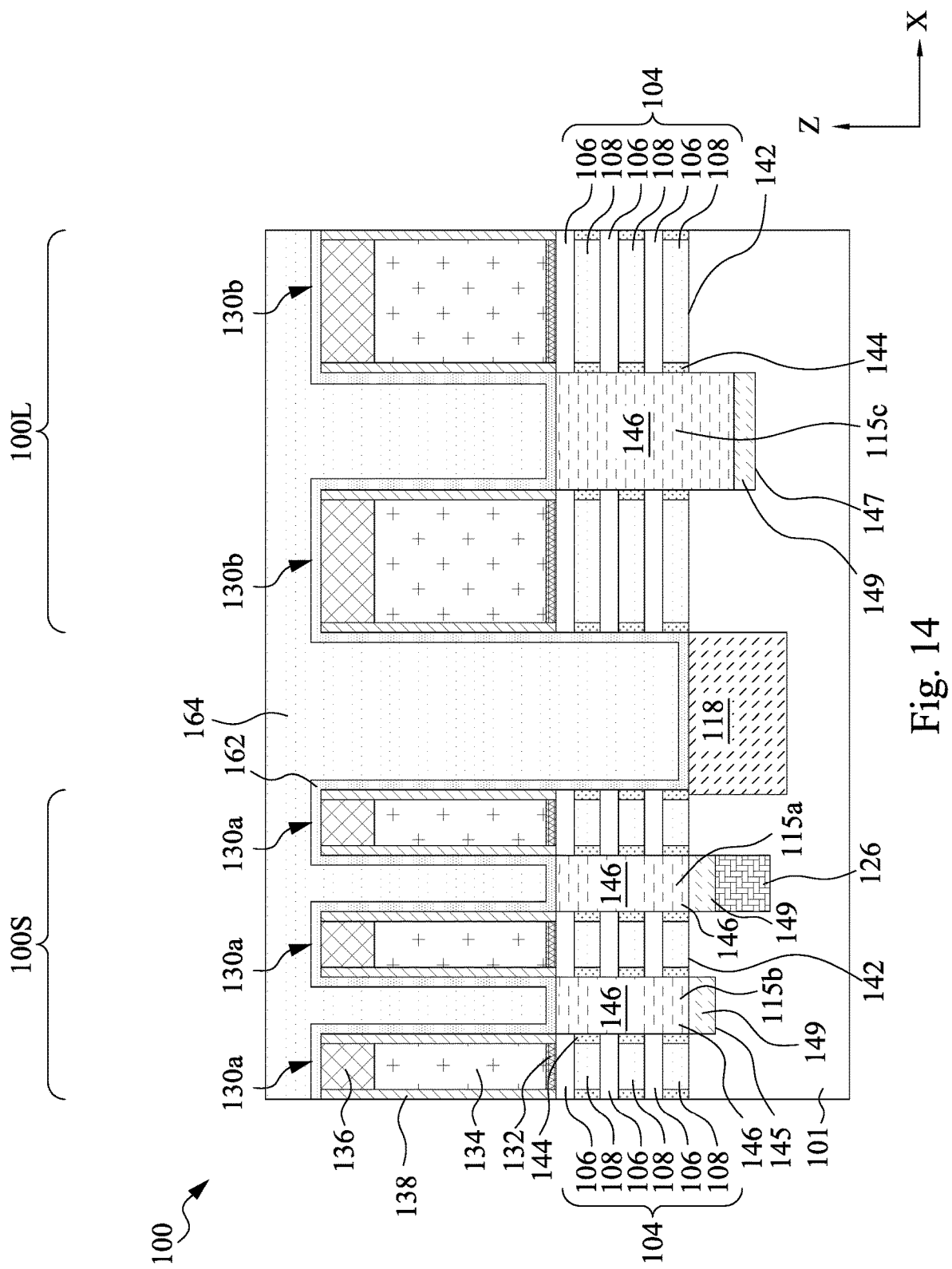

In FIG. 14, a contact etch stop layer (CESL) 162 is conformally formed on the exposed surfaces of the semiconductor device structure 100. The CESL 162 covers the sidewalls of the sacrificial gate structure 130a, 130b in the short and long channel regions 100S, 100L, the insulating material 118, the epitaxial S/D features 146, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The first ILD layer 164 fills the trenches between the sacrificial gate structures 130a in the short channel region 100S, the trenches between the sacrificial gate structures 130b in the long channel region 100L, and the trench formed between the sacrificial gate structure 130a and the sacrificial gate structure 130b. The materials for the first ILD layer 164 may include compounds comprising Si, O, C, and/or H, such as silicon oxide, TEOS oxide, SiCOH and SiOC. Organic materials, such as polymers, may also be used for the first ILD layer 164. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figure 15:
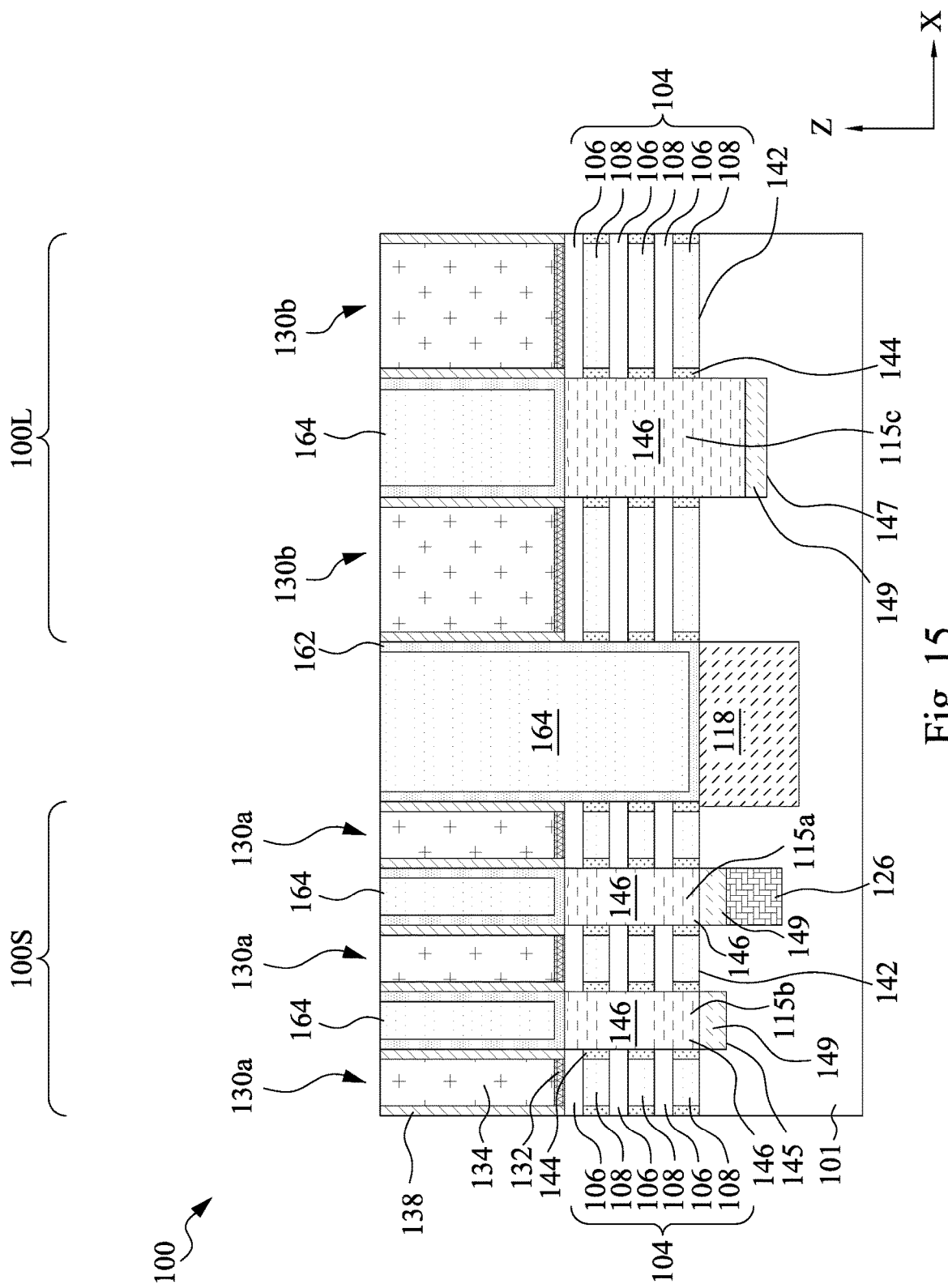

In FIG. 15, after the first ILD layer 164 is formed, a planarization operation, such as CMP, is performed on the semiconductor device structure 100 until the sacrificial gate electrode layer 134 is exposed.

Figure 16:
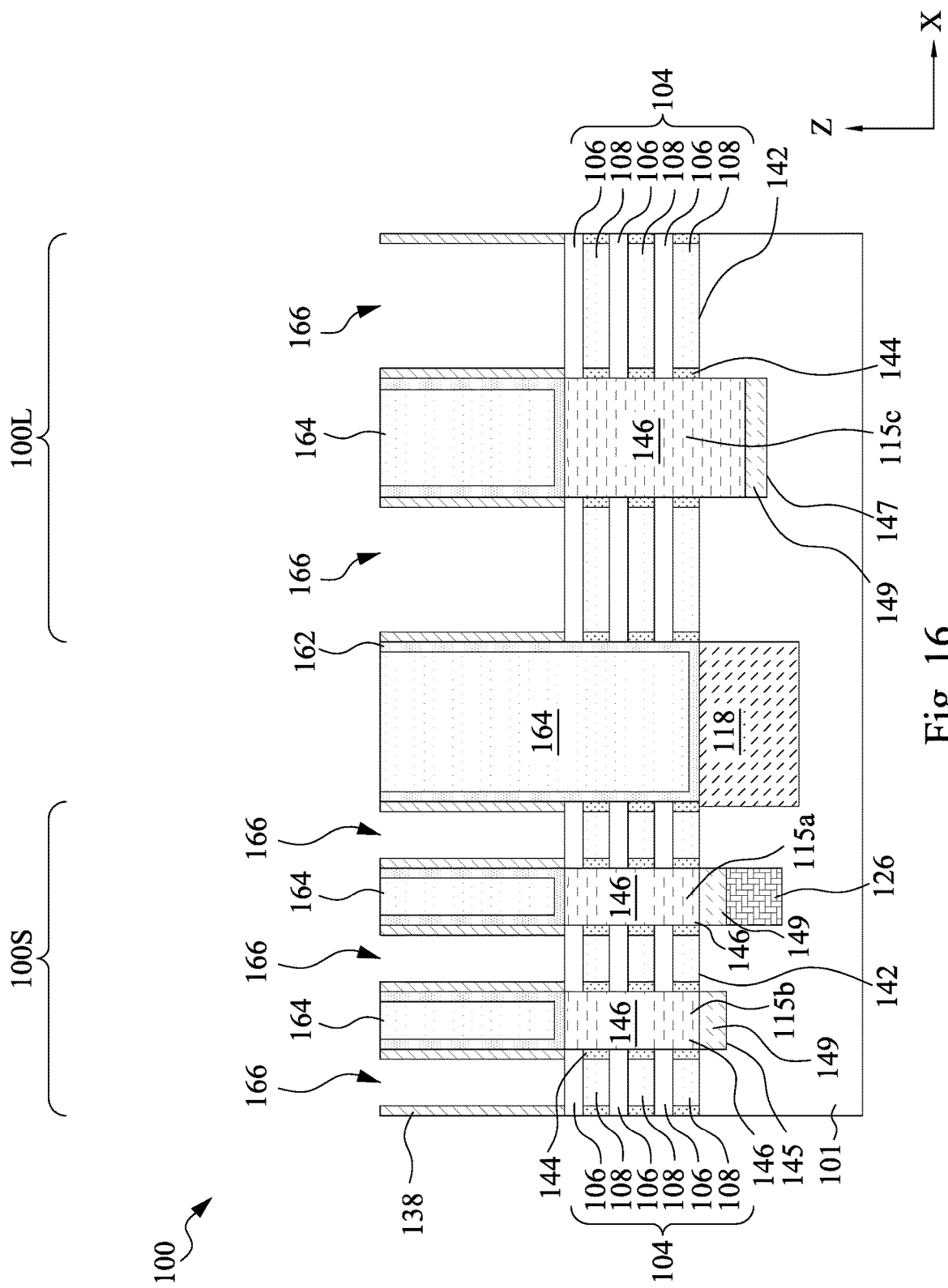

In FIG. 16, the sacrificial gate structures 130a, 130b in the short channel region 100S and the long channel region 100L are removed. The first ILD layer 164 protects the epitaxial S/D features 146 during the removal of the sacrificial gate structures 130a, 130b. The sacrificial gate structures 130a, 130b can be removed using plasma dry etching and/or wet etching. For example, in cases where the sacrificial gate electrode layer 134 is polysilicon and the first ILD layer 164 is silicon oxide, a wet etchant such as a tetramethylammonium hydroxide (TMAH) solution can be used to selectively remove the sacrificial gate electrode layer 134 without removing the dielectric materials of the first ILD layer 164, the CESL 162, and the gate spacers 138. The sacrificial gate dielectric layer 132 is thereafter removed using plasma dry etching and/or wet etching. The removal of the sacrificial gate structures 130a, 130b (i.e., the sacrificial gate electrode layer 134 and the sacrificial gate dielectric layer 132) forms a trench 166 in the regions where the sacrificial gate electrode layer 134 and the sacrificial gate dielectric layer 132 were removed. The trench 166 exposes the top and sides of the stack of semiconductor layers 104 (e.g., the first semiconductor layers 106 and the second semiconductor layers 108).

Figure 17:
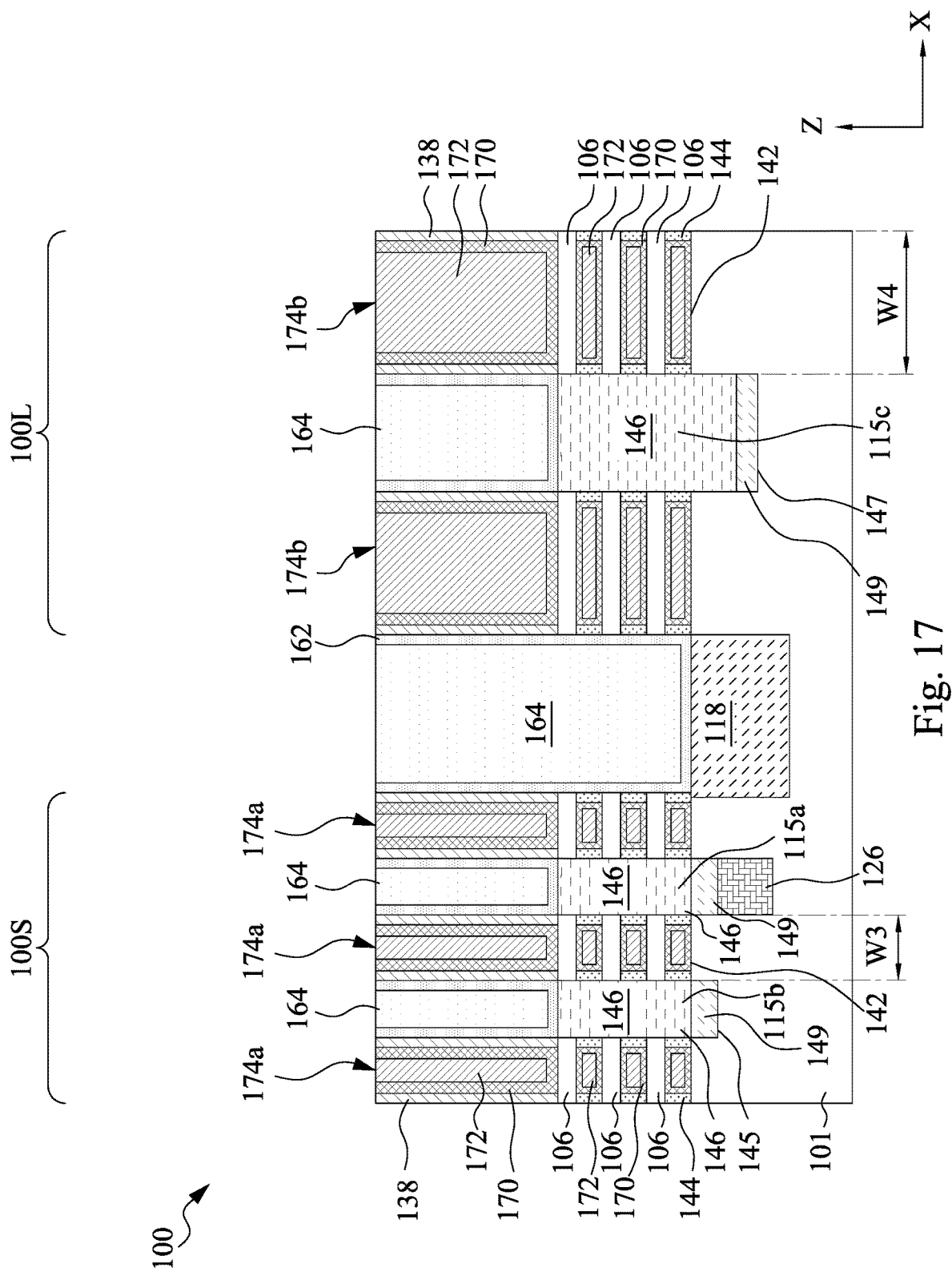

In FIG. 17, the second semiconductor layers 108 are removed, leaving the first semiconductor layers 106 and the dielectric spacers 144. After the sacrificial gate dielectric layer 132 and the sacrificial gate electrode layer 134 are removed, the first semiconductor layers 106 and the second semiconductor layers 108 in the short channel region 100S and the long channel region 100L are exposed. The removal of the second semiconductor layers 108 result in gaps formed between the dielectric spacers 144, and the first semiconductor layers 106 connecting the epitaxial S/D features 146. Each first semiconductor layer 106 may have a surface along the longitudinal direction of the semiconductor layer 106, and the majority of that surface is exposed as the result of the removal of the second semiconductor layers 108. The exposed surface will be surrounded by a gate electrode layer formed subsequently. Each first semiconductor layer 106 forms a nanosheet channel of the nanosheet transistor.

The second semiconductor layers 108 may be removed using any suitable selective removal process, such as selective wet etching process. In cases where the second semiconductor layers 108 are made of SiGe or Ge and the first semiconductor layers 106 are made of Si, the chemistry used in the selective wet etching process removes the SiGe while not substantially affecting Si, the dielectric materials of the gate spacers 138, and the dielectric spacers 144. In one embodiment, the second semiconductor layers 108 can be removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

After the formation of the nanosheet channels (i.e., the exposed first semiconductor layers 106), a gate dielectric layer 170 is formed around each first semiconductor layer 106, and a gate electrode layer 172 is formed on the gate dielectric layer 170, surrounding a portion of each first semiconductor layer 106, as shown in FIG. 17. The gate dielectric layer 170 and the gate electrode layer 172 in the short channel region 100S may be collectively referred to as a gate structure 174a. The gate dielectric layer 170 and the gate electrode layer 172 in the long channel region 100L may be collectively referred to as a gate structure 174b. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-K dielectric materials, and/or combinations thereof. The gate dielectric layer 170 may be formed by CVD, ALD or any suitable deposition technique. In one embodiment, the gate dielectric layer 170 is formed using a conformal deposition process such as ALD in order to ensure the formation of a gate dielectric layer having a uniform thickness around each first semiconductor layer 106.

The gate electrode layer 172 is formed on the gate dielectric layer 170 to surround a portion of each first semiconductor layer 106. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the first ILD layer 164. The gate dielectric layer 170 and the gate electrode layer 172 formed over the first ILD layer 164 are then removed by using, for example, CMP, until the top surface of the first ILD layer 164 is exposed.

The resulting nanosheet channels in the short channel region 100S (e.g., the first semiconductor layer 106 being surrounded by the gate electrode layer 172) have a length "W3", and the resulting nanosheet channels in the long channel region 100L (e.g., the first semiconductor layer 106 being surrounded by the gate electrode layer 172) have a length "W4". The length "W3" is less than the length "W4".

Figure 18:
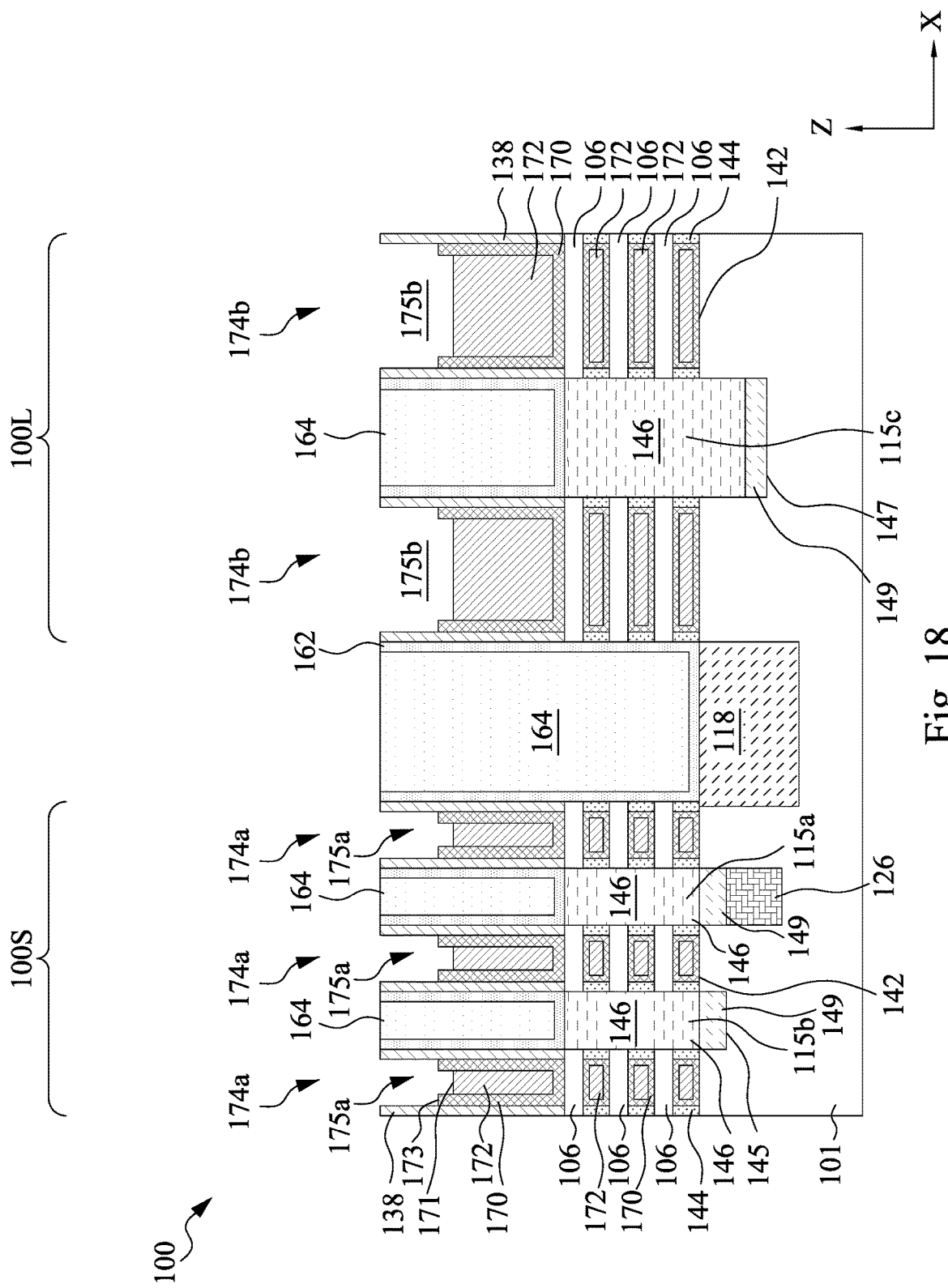

In FIGS. 18, a metal gate etching back (MGEB) process is performed to remove portions of the gate dielectric layer 170 and the gate electrode layer 172 in the short channel region 100S and the long channel region 100L, respectively. Trenches 175a, 175b are formed in the region between neighboring gate spacers 138 as the result of the removal of the portions of the gate dielectric layer 170 and the gate electrode layer 172 in the short channel region 100S and the long channel region 100L. The MGEB process may be a plasma etching process employing one or more etchants such as chlorine-containing gas, a bromine-containing gas, and/or a fluorine-containing gas. After the MGEB process, a top surface 171 of the gate electrode layer 172 is lower than a top surface 173 of the gate dielectric layer 170.

Figure 19:
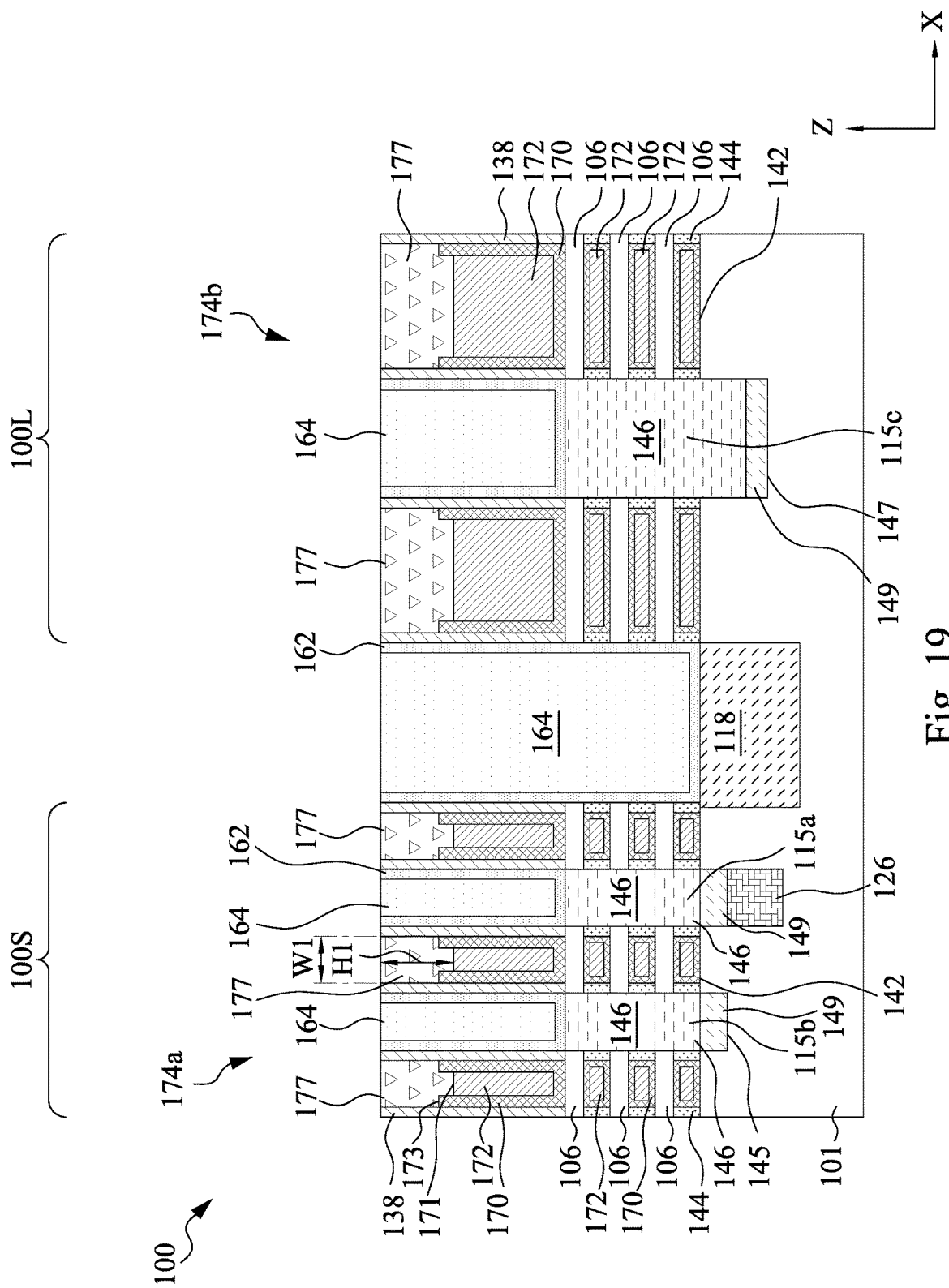

In FIG. 19, a first dielectric cap layer 177 may be optionally formed in the trenches 175a, 175b over the gate structures 174a, 174b at the short channel region 100S and the long channel region 100L, respectively. The first dielectric cap layer 177 fills in the trenches 175a, 175b and over the first ILD layer 164 to a pre-determined height using a deposition process, such as CVD, PECVD, or FCVD or any suitable deposition technique, followed by a CMP process to remove excess the first dielectric cap layer 177 outside the trenches 175a, 175b. The first dielectric cap layer 177 can have different etch selectivity than the gate spacers 138, the CESL layer 162, and the first ILD layer 164 so as to selective etch back the first dielectric cap layer 177. The first dielectric cap layer 177 may include or be formed of an oxygen-containing material, a nitrogen-containing material, or a silicon-containing material. Exemplary materials for the first dielectric cap layer 177 may include, but are not limited to, SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof. The first dielectric cap layer 177 can be used to define self-aligned contact region and thus referred to as SAC structures.

The resulting first dielectric cap layer 177 in the short channel region 100S may have a height "H1" in a range from about 1 nm to about 50 nm, and a width "W1" in a range from about 5 nm to about 30 nm.

Figure 20:
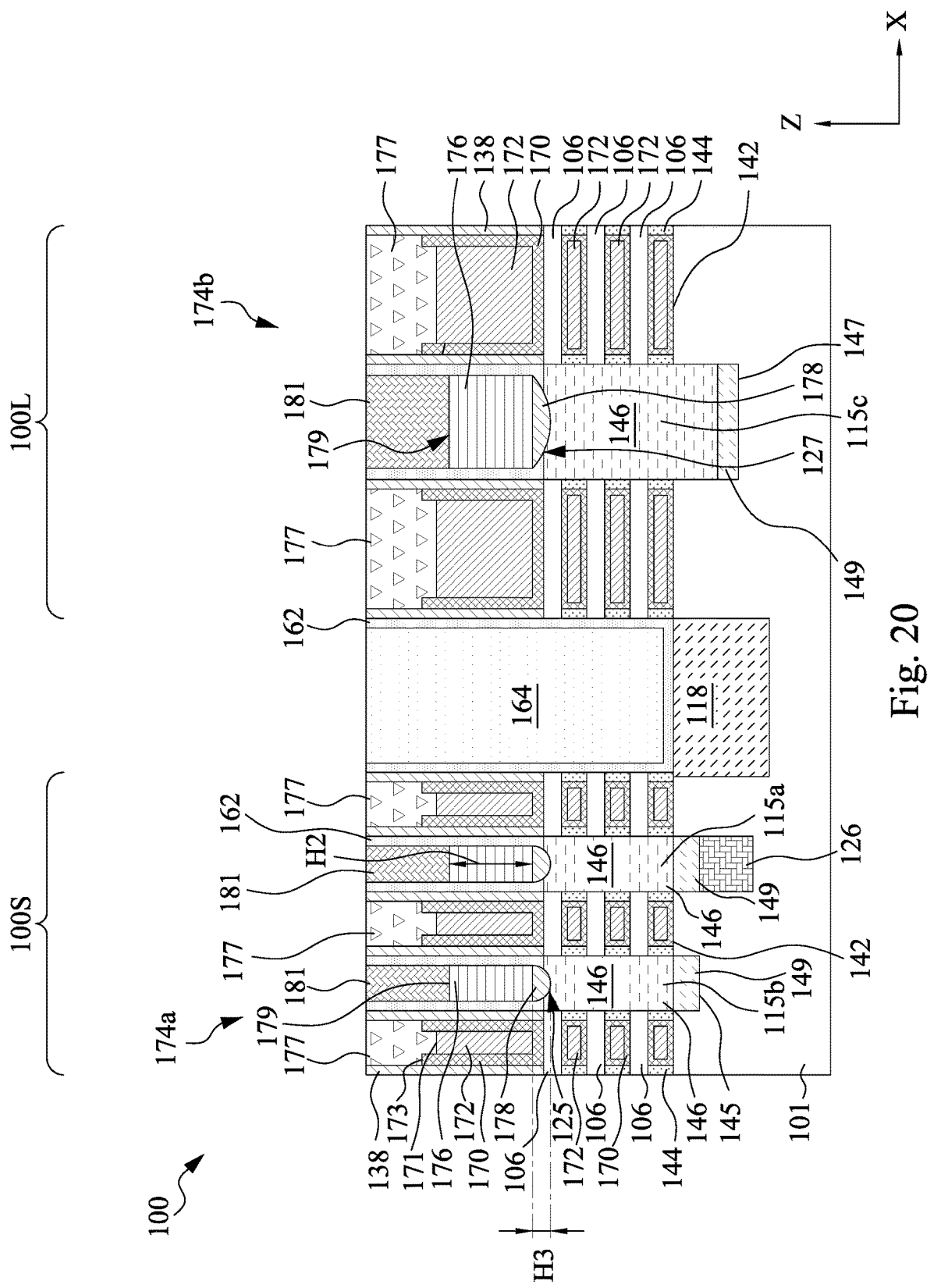

In FIG. 20, the front side S/D contacts 176 are formed in the first ILD layer 164 in the short channel region 100S and the long channel region 100L, respectively. The front side S/D contacts 176 are formed by removing the first ILD layer 164 and portions of the CESL layer 162, which forms contact openings that exposes the epitaxial S/D features 146. The first ILD layer 164 and the portions of the CESL layer 162 are removed using suitable photolithographic and etching techniques. In some embodiments, the upper portions of the epitaxial S/D features 146 may be etched. Depending on the process recipe used to remove the first ILD layer 164 and the portions of the CESL layer 162, the etched surface of the epitaxial S/D features 146 may have a planar profile, or a non-planar profile, such as a concave profile (dishing), or a convex profile (protruded). In one embodiment shown in FIG. 20, the etched surface 125, 127 of the epitaxial S/D features 146 in the short channel region 100S and long channel region 100L has a concave profile, respectively.

After the formation of the contact openings, a silicide layer 178 is formed on the epitaxial S/D features 146 at the short channel region 100S and the long channel region 100L, respectively. The bottom of the silicide layer 178 may have a profile (e.g., a concave profile) in accordance with the profile of the upper portion of the epitaxial S/D features 146. The silicide layer 178 conductively couples the epitaxial S/D features 146 to the subsequently formed front side S/D contacts 176. The silicide layer 178 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 178. Unreacted portion of the metal source layer is then removed. For n-channel FETs, the silicide layer 178 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 178 may be made of a material including one or more of NiSi, CoSi, MnSi, Wsi, FeSi, RhSi, PdSi, RuSi, PtSi, IrSi, OsSi, or combinations thereof. In some embodiments, the silicide layer 178 is made of a metal or metal alloy silicide, and the metal includes a noble metal, a refractory metal, a rare earth metal, alloys thereof, or combinations thereof. Next, a conductive material is formed in the contact openings and form the front side S/D contacts 176. The conductive material may be made of a material including one or more of Ru, Mo, Co, Ni. W, Ti, Ta, Cu, Al, TiN and TaN, and can be formed by CVD, ALD, electro-plating, or other suitable deposition technique. While not shown, a barrier layer (e.g., TiN, TaN, or the like) may be formed on sidewalls of the contact openings prior to forming the front side S/D contacts 176.

The resulting front side S/D contacts 176 in the short and long channel regions 100S, 100L may have a height "H2" in a range from about 1 nm to about 50 nm. The resulting silicide layer 178 in the short and long channel regions 100S, 100L may have a height "H3" in a range from about 1 nm to about 10 nm.

In some embodiments, the front side S/D contacts 176 in the short channel region 100S and the long channel region 100L are formed so that the top surface 179 of the front side S/D contacts 176 is at a level higher than the top surface 173 of the gate dielectric layer 170. In some embodiments, the front side S/D contacts 176 in the short channel region 100S and the long channel region 100L are formed so that the top surface 179 of the front side S/D contacts 176 is at a level about the same as the top surface 173 of the gate dielectric layer 170. In some embodiments, the front side S/D contacts 176 in the short channel region 100S and the long channel region 100L are formed so that the top surface 179 of the front side S/D contacts 176 is at a level lower than the top surface 173 of the gate dielectric layer 170.

After the front side S/D contacts 176 are formed, a second dielectric cap material 181 is formed on the front side S/D contacts 176 in the short channel region 100S and the long channel region 100L, respectively. The second dielectric cap material 181 fills in the region defined by the front side S/D contacts 176 and the CESL 162 and over the first ILD layer 164 to a pre-determined height using a deposition process, such as CVD, PECVD, or FCVD or any suitable deposition technique. A planarization process, such as CMP, is then performed to remove excess deposition of the second dielectric cap layer 181 and expose the top surface of the first ILD layer 164. The second dielectric cap material 181 may include or be formed of oxygen-containing materials, nitrogen-containing materials, or silicon-containing materials. Exemplary materials for the second dielectric cap layer 181 may include, but are not limited to, SiC, SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof. The second dielectric cap material 181 can have different etch selectivity than the first dielectric cap layer 177, the gate spacers 138, the CESL layer 162, and the first ILD layer 164 so as to selective etch back the second dielectric cap layer 181.

The front side S/D contacts 176 formed over the epitaxial S/D features 146 (e.g., the epitaxial S/D feature 146 formed over the drain region 115b) may be connected to signal lines in the subsequent formed front side interconnect structure. In some embodiments, the front side S/D contacts are formed over the epitaxial S/D features 146 (e.g., the epitaxial S/D feature 146 formed over the source region 115a) for structural balance in the device, and the epitaxial S/D feature 146 formed over the source region 115a is to be connected to a power rail, such as a positive voltage (VDD) or a negative voltage (VSS or GND) disposed on a backside of the substrate 101. In such a case, the epitaxial S/D feature 146 are not further connected to any contacts subsequently formed in a front side interconnect structure.

Figure 21:
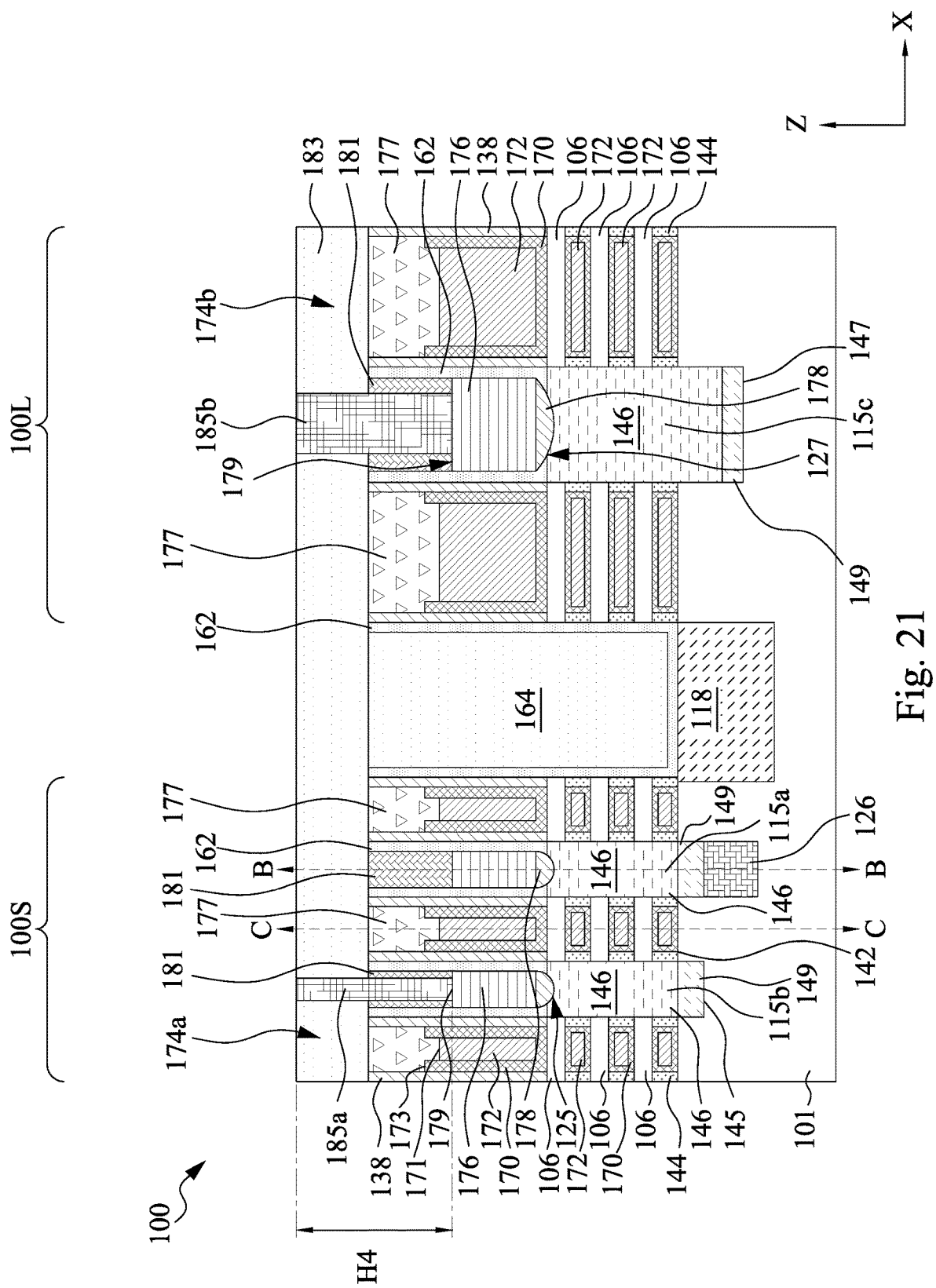

In FIG. 21, a second ILD layer 183 is formed over the first ILD layer 164, and a conductive feature 185a, 185b is formed in the second ILD layer 183 at the short channel region 100S and long channel region 100L, respectively. The conductive features 185a, 185b are selectively formed to provide electrical connection to some of the front side S/D contacts 176 (e.g., S/D contact 176 at the drain region 115*b* and front side S/D contacts 176 at the drain region 115*c*). The conductive feature 185*a*, 185*b* may include or be formed of W, Ru, Co, Cu, Ti, TiN, Ta, TaN, Mo, Ni, or combinations thereof. The second ILD layer 183 may be formed of the same material as the first ILD layer 164. The conductive feature 185*a*, 185*b* may have a height "H4" in a range of about 1 nm to about 50 nm.

Figure 22:
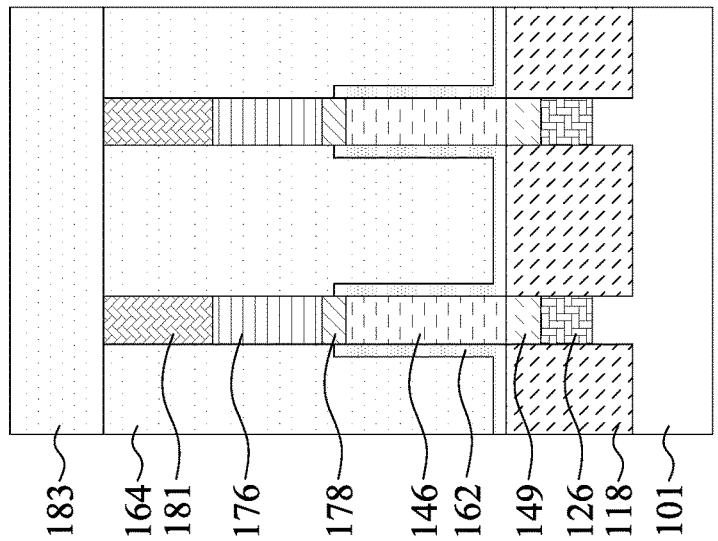
FIGS. 22-23 are cross-sectional side views of the semiconductor device structure taken along line B-B and line C-C of FIG. 21, respectively.
Figure 23:
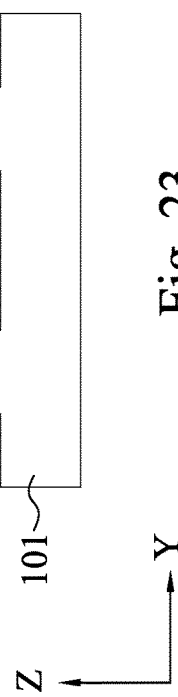

FIGS. 22 and 23 are cross-sectional views of the semiconductor device structure 100 taken along line B-B and line C-C of FIG. 21.

Figure 24:
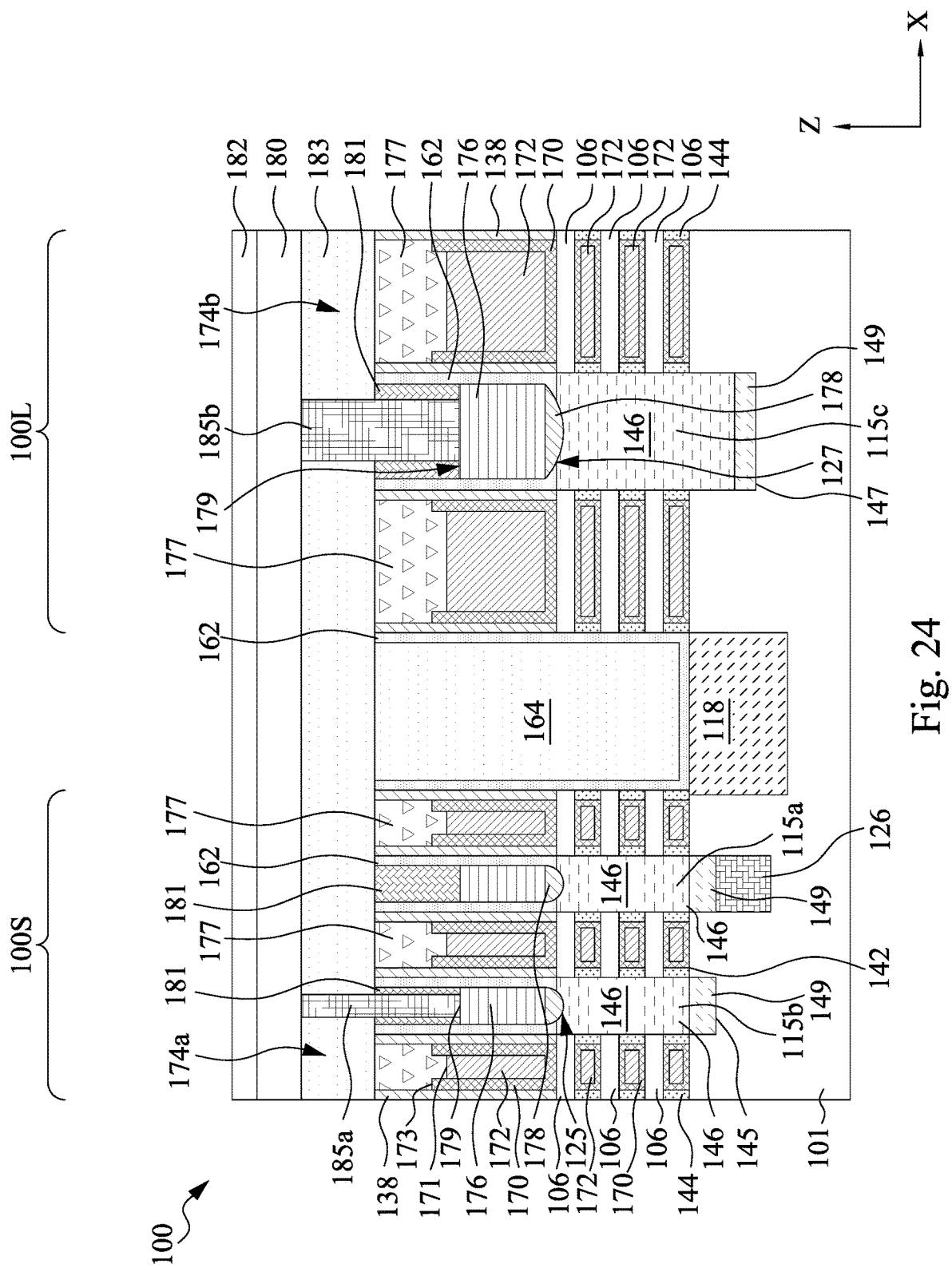
FIGS. 24-41 are cross-sectional side views of various stages of manufacturing the semiconductor device structure of FIG. 21 in accordance with some embodiments.

In FIG. 24, a front side interconnect structure 180 is formed on the substrate 101. The front side interconnect structure 180 can be a back-end-of-line (BEOL) interconnect structure including one or more layers of dielectric material having a plurality of metal lines (not shown) and vias (not shown) embedded therein. The metal lines and vias in the front side interconnect structure 180 may be formed of copper, copper alloys, or any suitable conductive material using one or more damascene processes. The metal lines and vias provide electrical paths to the features, such as the gate electrode layer 172 and epitaxial S/D features 146. In some embodiments, the front side interconnect structure 180 includes metal lines and vias for connecting signal lines only, but not connecting to power rails or connections to power rails. In some embodiments, the front side interconnect structure 180 includes a portion of power rails. Power rails include conductive lines connecting between the epitaxial S/D features 146 and a power source, such as VDD and VSS (GND).

After the formation of the front side interconnect structure 180, the substrate 101 is temporarily bonded to a carrier substrate 182. The carrier substrate 182 serves to provide mechanical support for the semiconductor device structure 100 so as to facilitate backside processing of the substrate 101.

Figure 25:
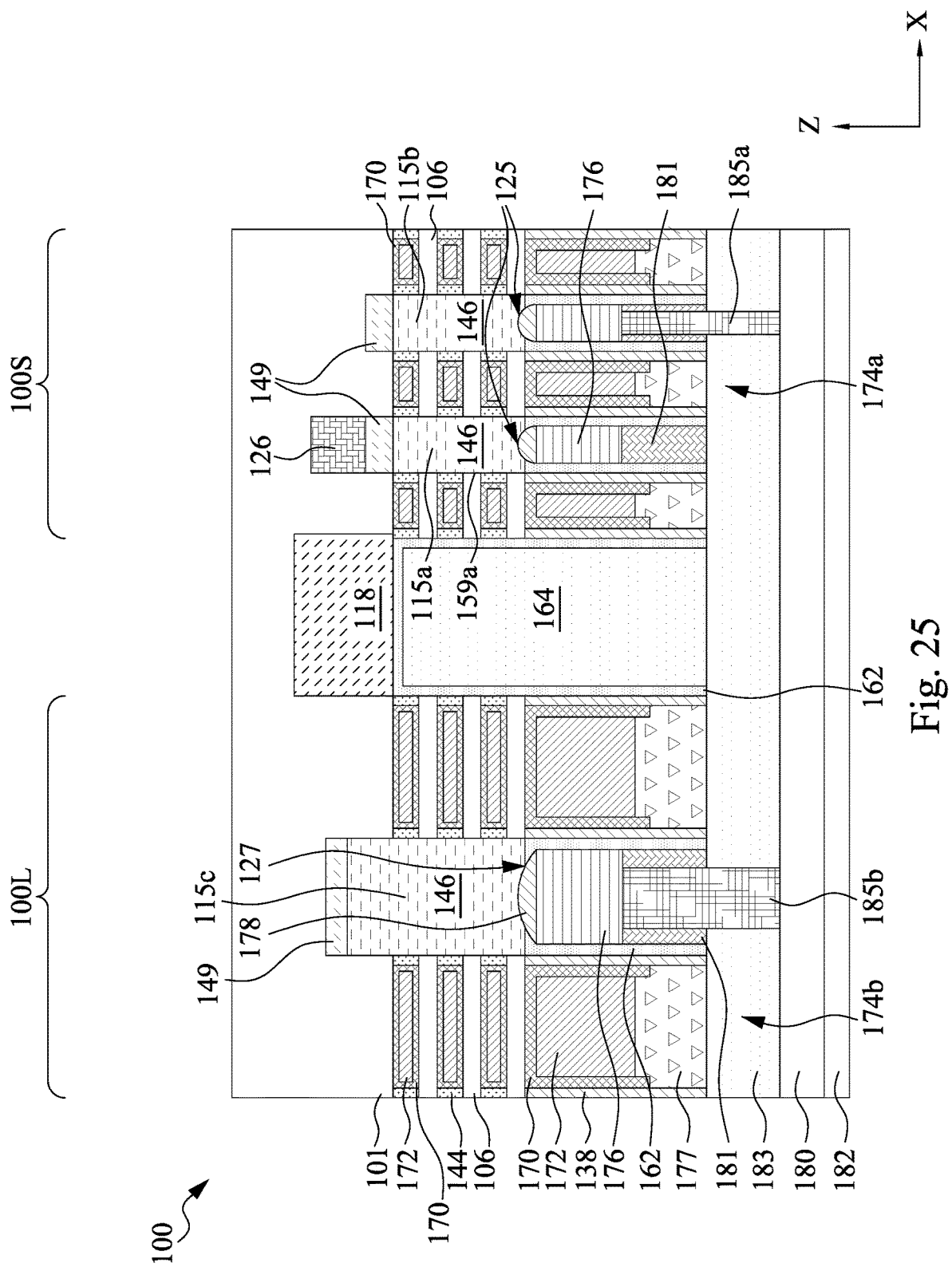

In FIG. 25, the semiconductor device structure 100 is flipped over so the substrate 101 as shown is over the epitaxial S/D features 146.

Figure 26:
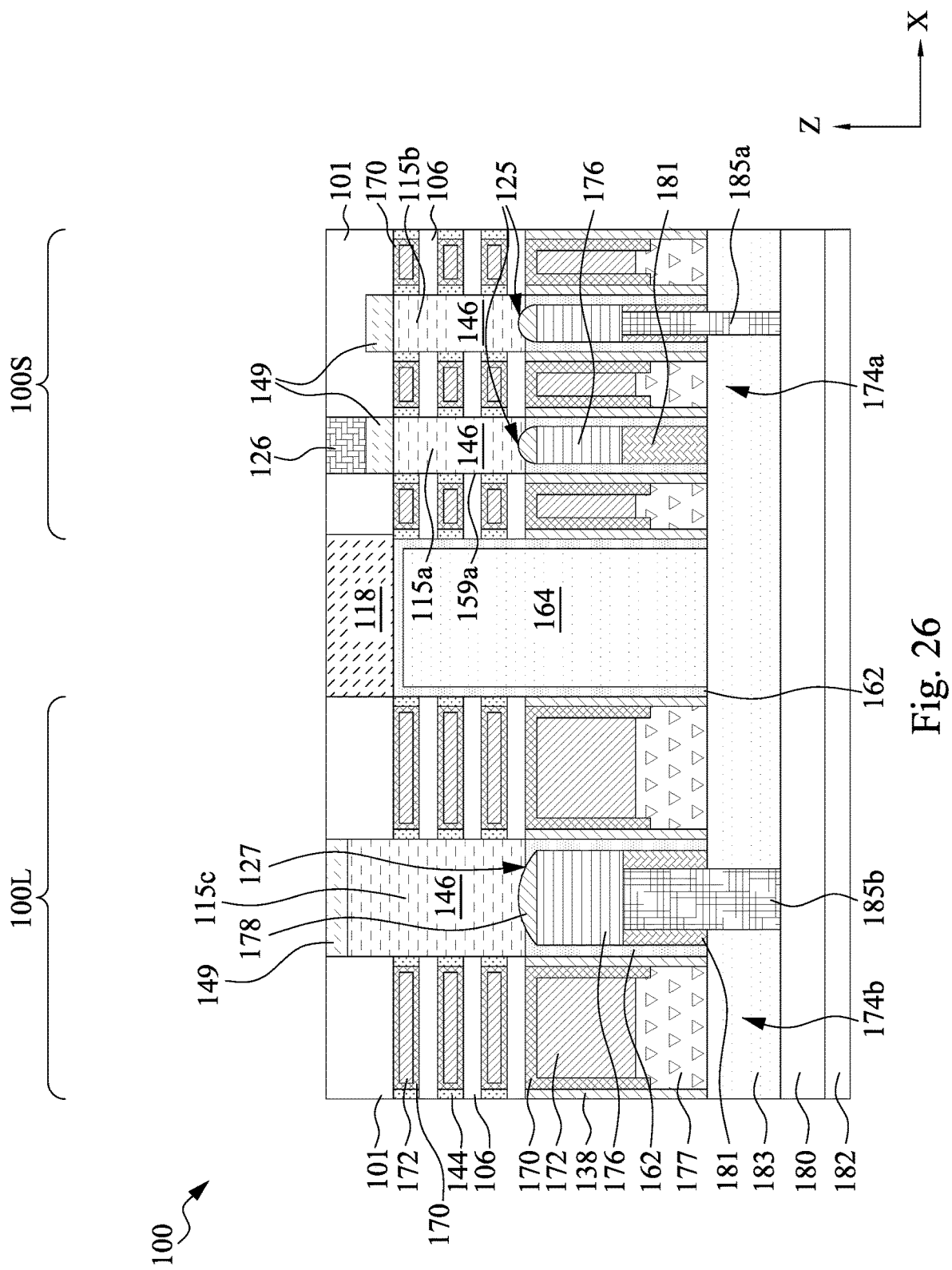

In FIG. 26, a backside grinding is performed to remove portions of the substate 101 and the insulating material 118 until a portion of the transitional epitaxial layers 149 at the drain regions of the long channel region 100L is exposed. A portion of the sacrificial layer 126 (or so-called backside contact alignment feature) of the short channel region 100S at the source regions (e.g., source region 115*a*) is also removed during the backside grinding.

Figure 27:
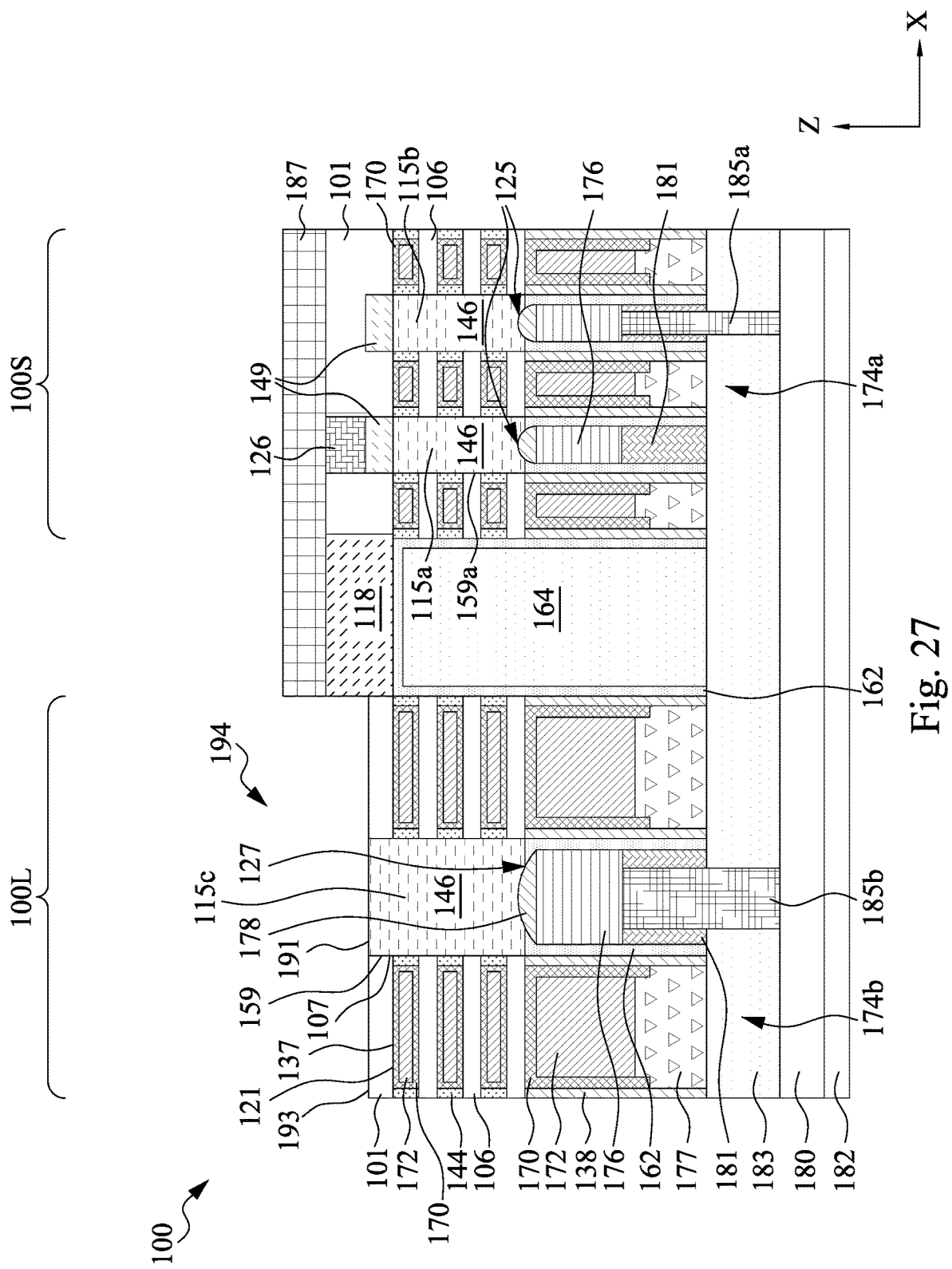

In FIG. 27, a patterned protective layer 187, such as a hardmask layer, is deposited on the portion of the substrate 101. The patterned protective layer 187 may be formed by a photolithography process and one or more etch processes. The patterned protective layer 187 covers the insulating material 118, the substrate 101 in the short channel region 100S, and the sacrificial layer 126, leaving the substrate 101 in the long channel region 100L and the transitional epitaxial layer 149 exposed. Then, portions of the substrate 101, the transitional epitaxial layers 149, and portions of the epitaxial S/D features 146 in the long channel region 100L, which are not covered by the patterned protective layer 187, are removed from the backside by one or more etching processes.

Portions of the substrate 101 in the long channel region 100L can be removed using an etch process having an etch selectivity for the material of the substrate 101 over the materials of the transitional epitaxial layers 149. In cases where the substrate 101 is Si and the transitional epitaxial layer 149 is SiGeB, the transitional epitaxial layer 149 can be selectively etched by using a wet etchant such as, but not limited to, ammonium hydroxide (NH40H), tetramethylammonium hydroxide (TMAH), ethylenediamine pyrocatechol (EDP), or potassium hydroxide (KOH) solutions. For p-channel FETs where the epitaxial S/D features 146 are formed of, for example, Si or SiGe, the same etch process may be used to selectively remove portions of the exposed epitaxial S/D features 146 in the long channel region 100L. The etch process may continue until a bottom surface 191 of the epitaxial S/D features 146 (e.g., the epitaxial S/D feature 146 at the drain region 115*c*) and a bottom surface 193 of the substrate 101 in the long channel region 100L are substantially co-planar, as shown in FIG. 27. In such embodiments, a portion of the sidewall 159*b* (which is also co-planar with a sidewall 107 of the substrate 101 in the long channel region 100L) of the epitaxial S/D features 146 in the long channel region 100L (e.g., the epitaxial S/D feature 146 at the drain region 115*c*) remains in contact with the substrate 101. The removal of the transitional epitaxial layer 149, the portions of the exposed epitaxial S/D features 146 and portions of the substate 101 in the long channel region 100L results in an opening 194 over the bottom surface 191 of the remaining epitaxial S/D features 146 (e.g., the epitaxial S/D feature 146 at the drain region 115*c*) and the bottom surface 193 of the substrate 101 in the long channel region 100L.

FIG. 27 also illustrates that portions of the sidewall 159*a* of the epitaxial S/D feature 146 in the short channel region 100S (e.g., the epitaxial S/D feature 146 at the drain region 115*b*) are in contact with the first semiconductor layer 106 and do not in contact with the substrate 101 in the short channel region 100S, which is to be removed at a later stage.

The removal of a portion of the epitaxial S/D features 146 in the long channel region 100L (e.g., the epitaxial S/D feature 146 at the drain region 115*c*) allows a subsequent backside contact feature (e.g., backside contact feature 198 in FIG. 39) to be formed with a shorter height in the short channel region 100S. A shorter backside contact feature has reduced contact area, and thus lower contact resistance at the source region (e.g., source region 115*a*). The capacitance between the source/drain regions and the gate electrode in the short channel regions can also be reduced. As a result, the device performance of the transistors is improved.

Figure 28:
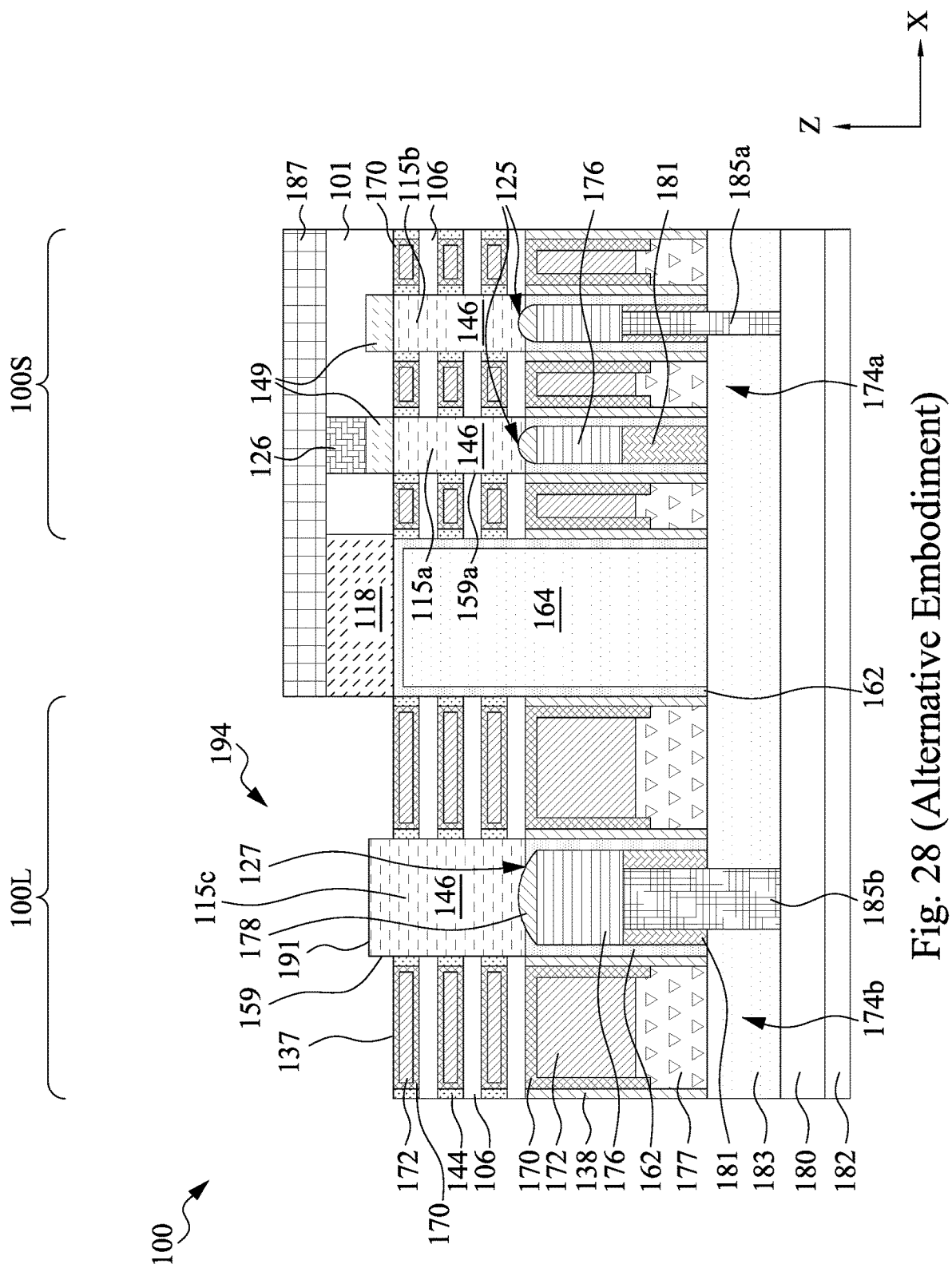
Figure 29:
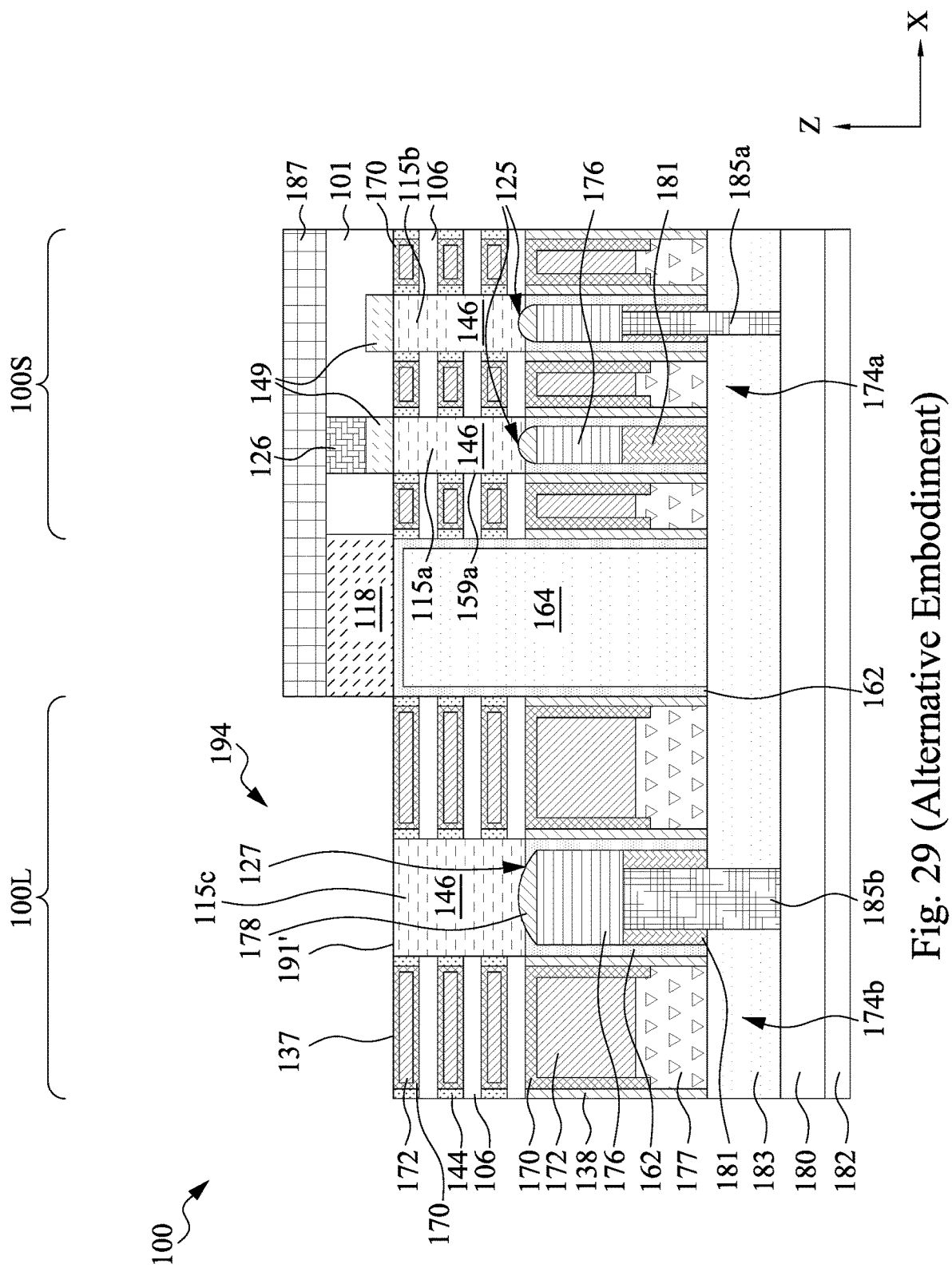
Figure 41:
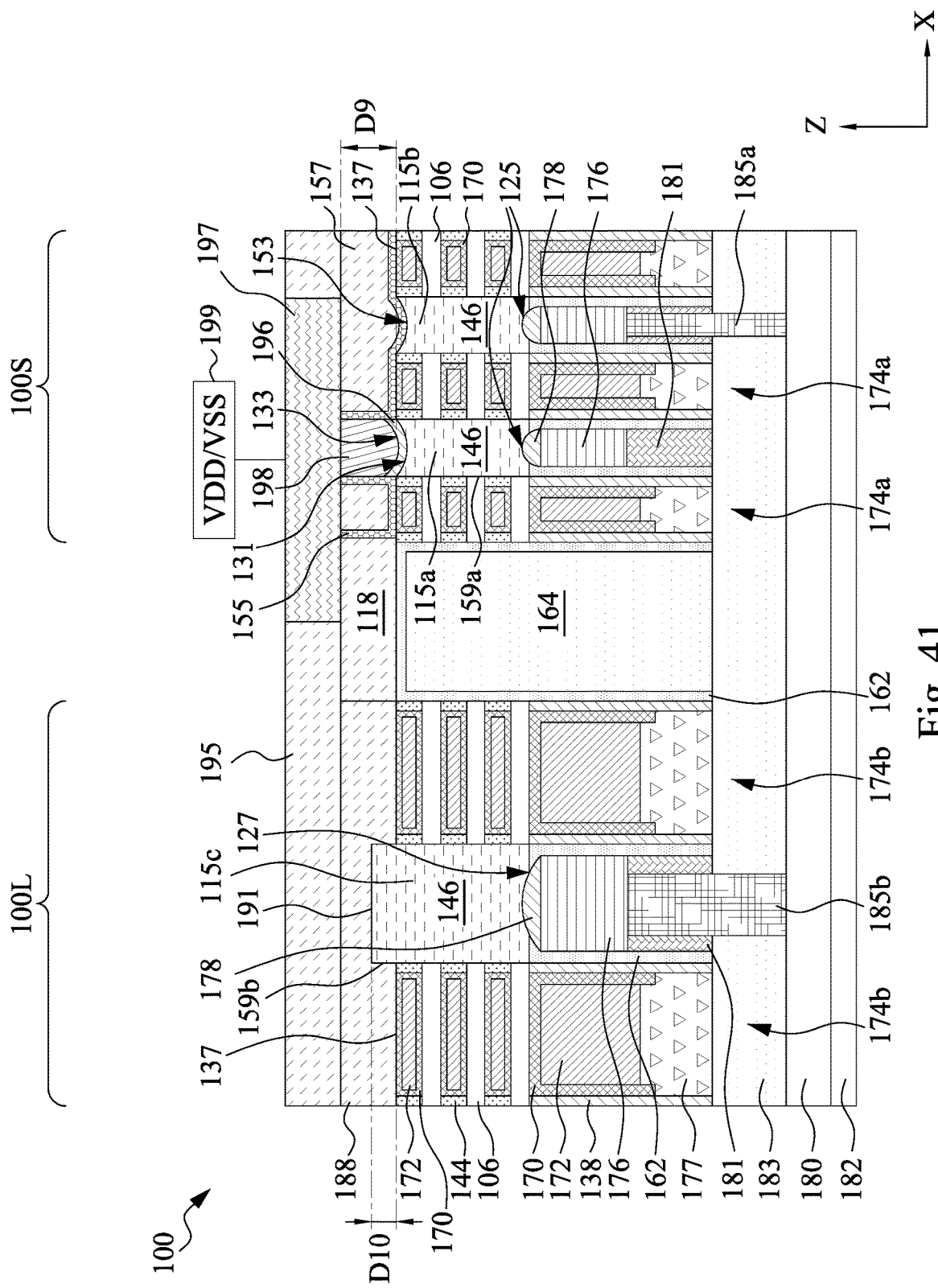

Depending on the materials of the epitaxial S/D features 146 and the substrate 101, the etch process may completely remove the substrate 101 in the long channel region 100L so that the sidewall 159*b* of the epitaxial S/D features 146 in the long channel region 100L (e.g., the epitaxial S/D feature 146 at the drain region 115*c*) is exposed, as an alternative embodiment shown in FIG. 28. The sidewall 159*b* of the epitaxial S/D features 146 is to be in contact with a subsequently formed refill dielectric layer 188, as shown in FIG. 41. In some cases where the epitaxial S/D features 146 are formed of, for example, Si, for n-channel FETs, and the substrate is formed of Si, portions of the epitaxial S/D features 146 and the substrate 101 in the long channel region 100L are removed so that a bottom surface 191' of the epitaxial S/D features (e.g., the epitaxial S/D feature 146 at the drain region 115*c*) and a bottom surface 137 of the gate dielectric layer 170 in the long channel region 100L are substantially co-planar, as an alternative embodiment shown in FIG. 29.

Figure 30:
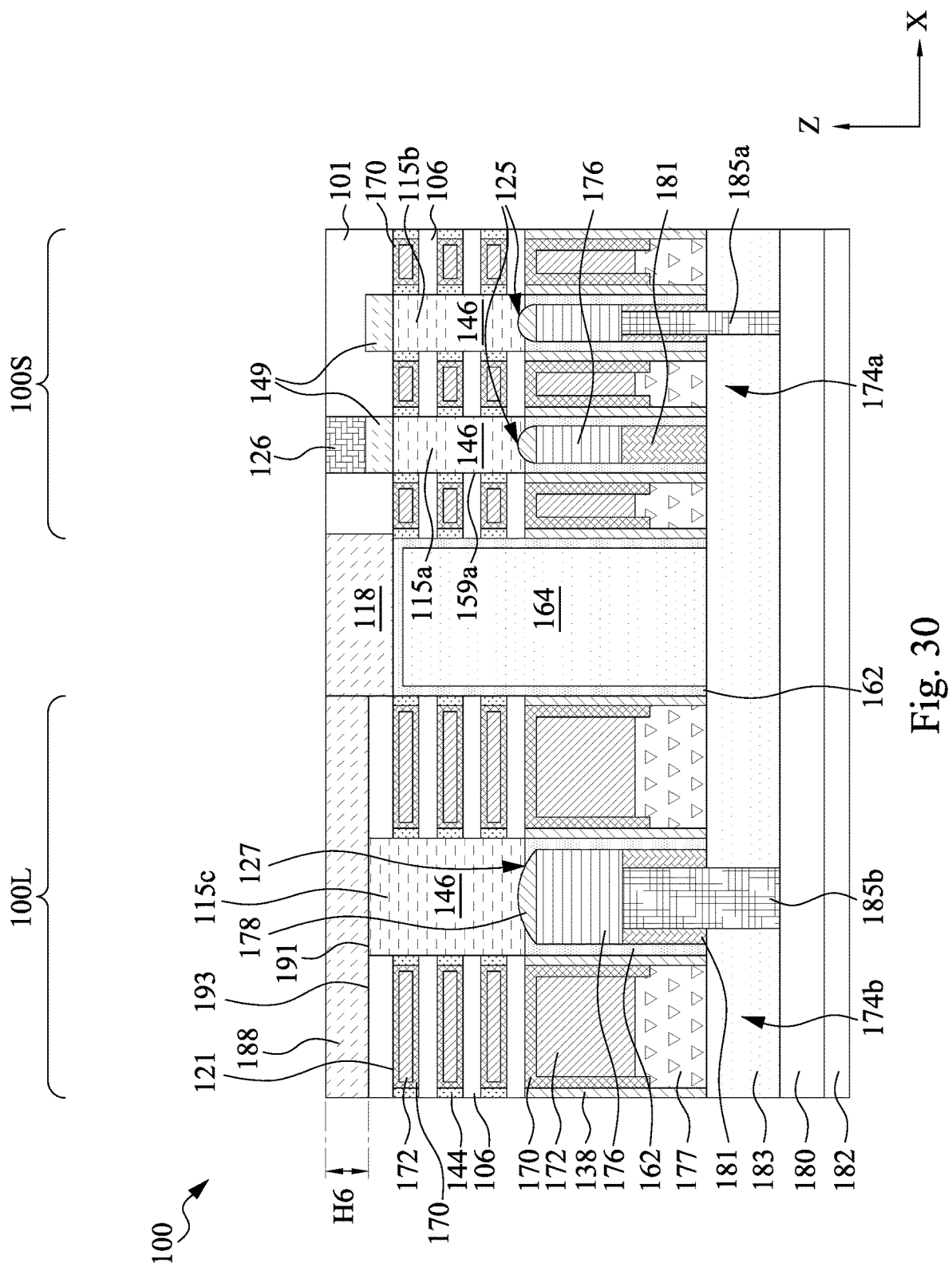

FIG. 30 illustrates a cross-sectional view of the semiconductor device structure 100 based on the embodiment shown in FIG. 27. In FIG. 30, the patterned protective layer 187 is removed and a refill dielectric layer 188 is deposited in the opening 194 where the transitional epitaxial layer 149, the portions of the exposed epitaxial S/D features 146 and portions of the substate 101 in the long channel region 100L were removed. The refill dielectric layer 188 fills the opening 194 (FIG. 29) and over the top of the insulating material 118. A planarization process, such as a CMP, is performed to expose the top of the insulating material 118. Therefore, the refill dielectric layer 188, the insulating material 118, the sacrificial layer 126 and the substrate 101 in the short channel region 100S are substantially co-planar. The refill dielectric layer 188 may include or be formed of an oxygen-containing material, a nitrogen-containing material, or a silicon-containing material. Exemplary materials for the refill dielectric layer 188 may include, but are not limited to, SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or combinations thereof, and can be formed by FCVD, a spin-on coating process, or any suitable deposition technique. In some embodiments, the refill dielectric layer 188 is formed of the same material as the first dielectric cap layer 177 or the insulating material 118. The resulting refill dielectric layer 188 may have a height "H6" in a range of about 5 nm to about 50 nm.

Figure 31:
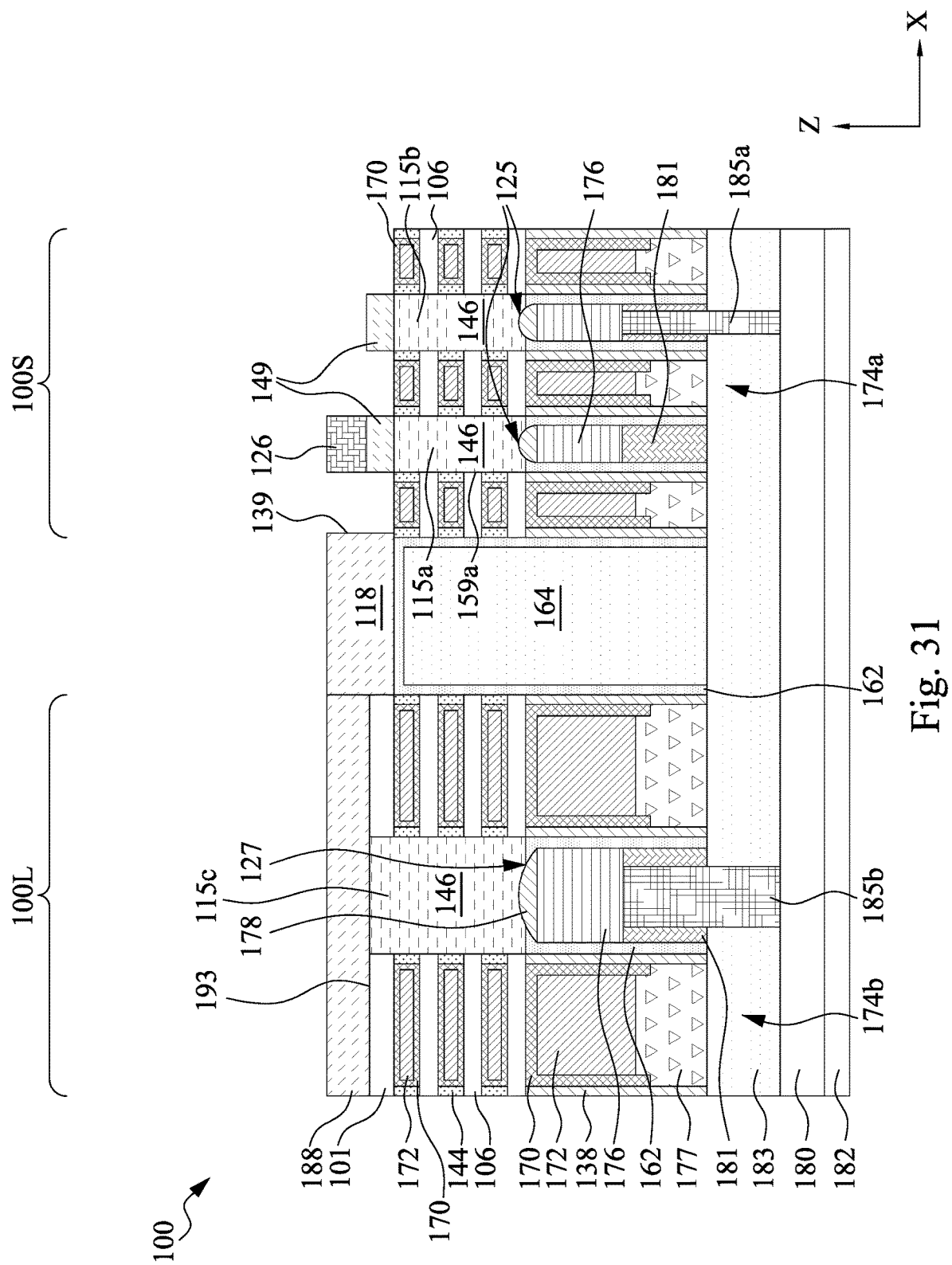

In FIG. 31, the substrate 101 in the short channel region 100S is removed using a suitable etch process. The etch process may use an etchant that can selectively remove the substrate 101 without substantially removing the sacrificial layer 126, the transitional epitaxial layers 149, the insulating material 118, the gate dielectric layers 170, the dielectric spacers 144 in the short channel region 100S, and the refill dielectric layer 188. The removal of the substrate 101 thus exposes the sacrificial layer 126, the transitional epitaxial layers 149, a sidewall 139 of the insulating material 118, the gate dielectric layers 170 and the dielectric spacers 144 in the short channel region 100S. When the substrate 101 is Si and the transitional epitaxial layers 149 are SiGe, the substrate 101 can be selectively removed using a wet etchant such as, but not limited to, ammonium hydroxide (NH4OH), tetramethylammonium hydroxide (TMAH), ethylenediamine pyrocatechol (EDP), or potassium hydroxide (KOH) solution.

Figure 32:
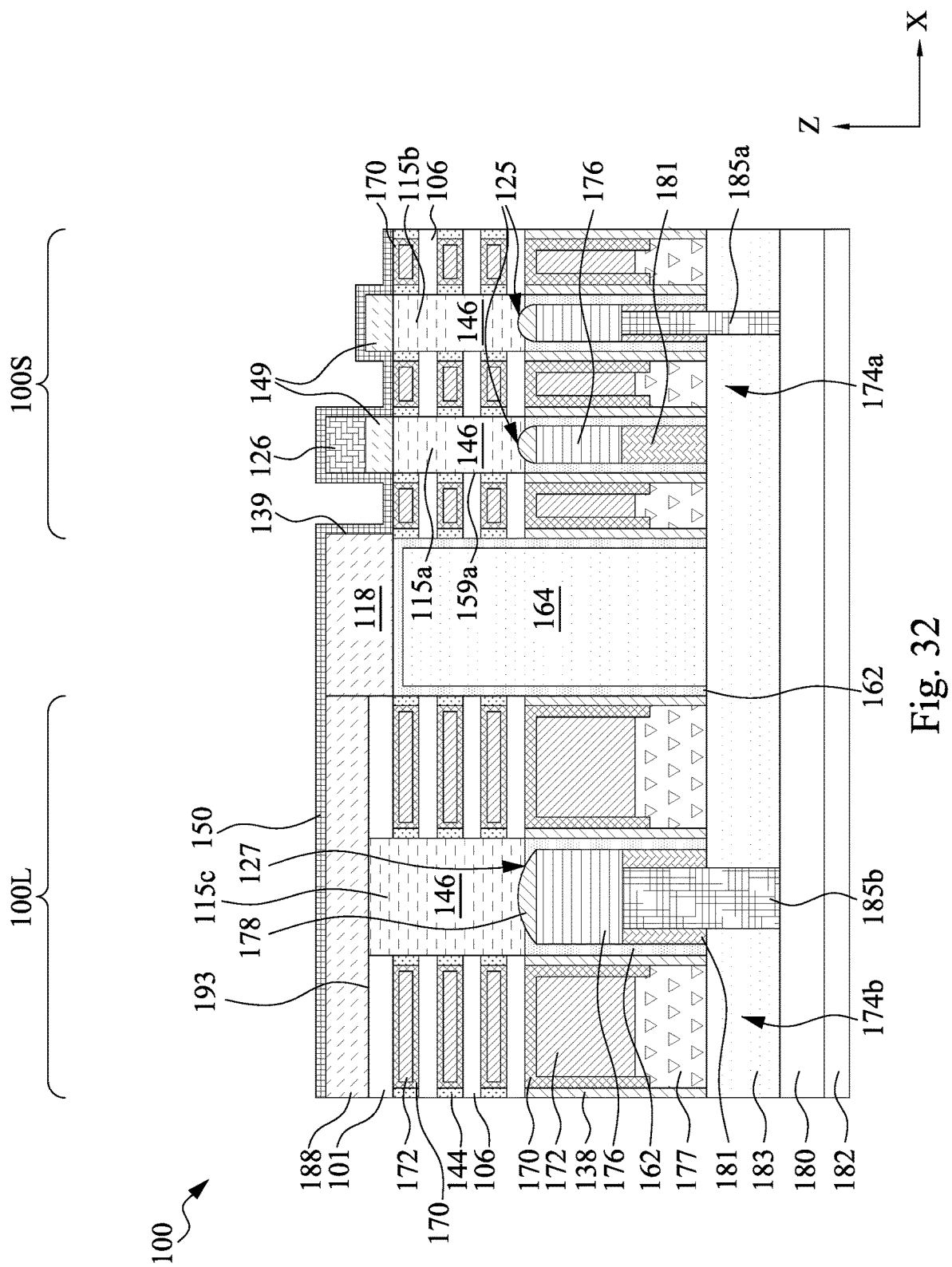

In FIG. 32, a first liner 151 is conformally formed on the backside of the semiconductor device structure 100, covering the exposed surfaces of the refill dielectric layer 188, the insulating material 118, the sacrificial layer 126, the transitional epitaxial layers 149, the gate dielectric layers 170 and the dielectric spacers 144 in the short channel region 100S. The first liner 151 may include or be made of a dielectric material, such as SiN, SiCN, SiOC, SiOCN, or the like. The first liner 151 may be formed by a conformal process, such as an ALD process.

Figure 33:
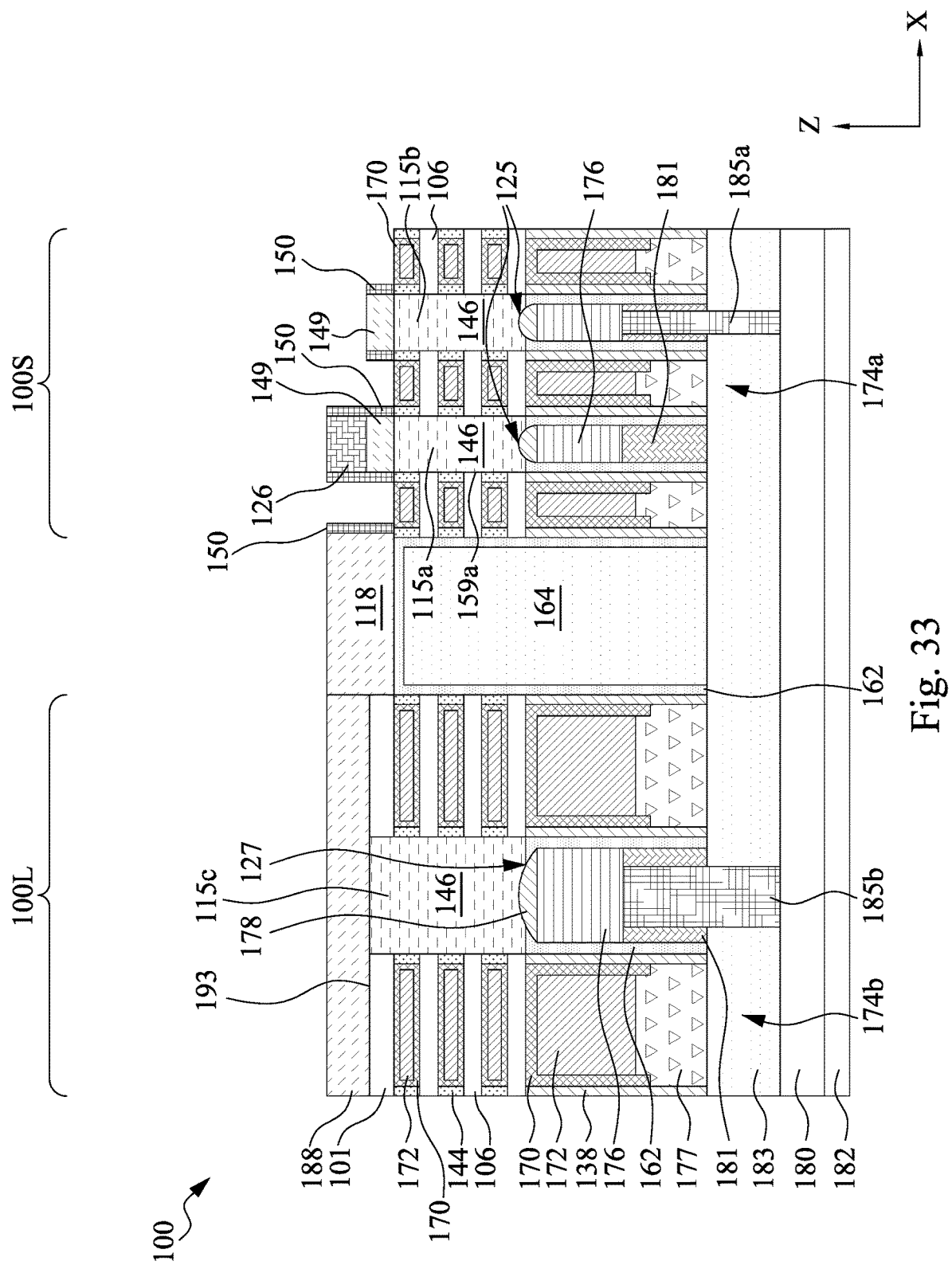

In FIG. 33, portions of the first liner 151 are removed using any suitable removal process, such as an anisotropic selective dry etch process. The anisotropic selective dry etch process removes portions of the first liner 151 from horizontal surfaces of the semiconductor device structure 100, such as the top of the refill dielectric layer 188, the insulating material 118, the sacrificial layer 126, and the gate dielectric layers 170, while leaving the first liner 151 on the vertical surfaces, such as the sidewalls of the insulating material 118, the sacrificial layer 126, and the transitional epitaxial layer 149. The remaining first liner 151 protects the vertical sidewalls of the sacrificial layer 126 and the transitional epitaxial layer 149 under the sacrificial layer 126 from being damaged during the subsequent removal of the transitional epitaxial layer 149 at the drain region 115b.

Figure 34:
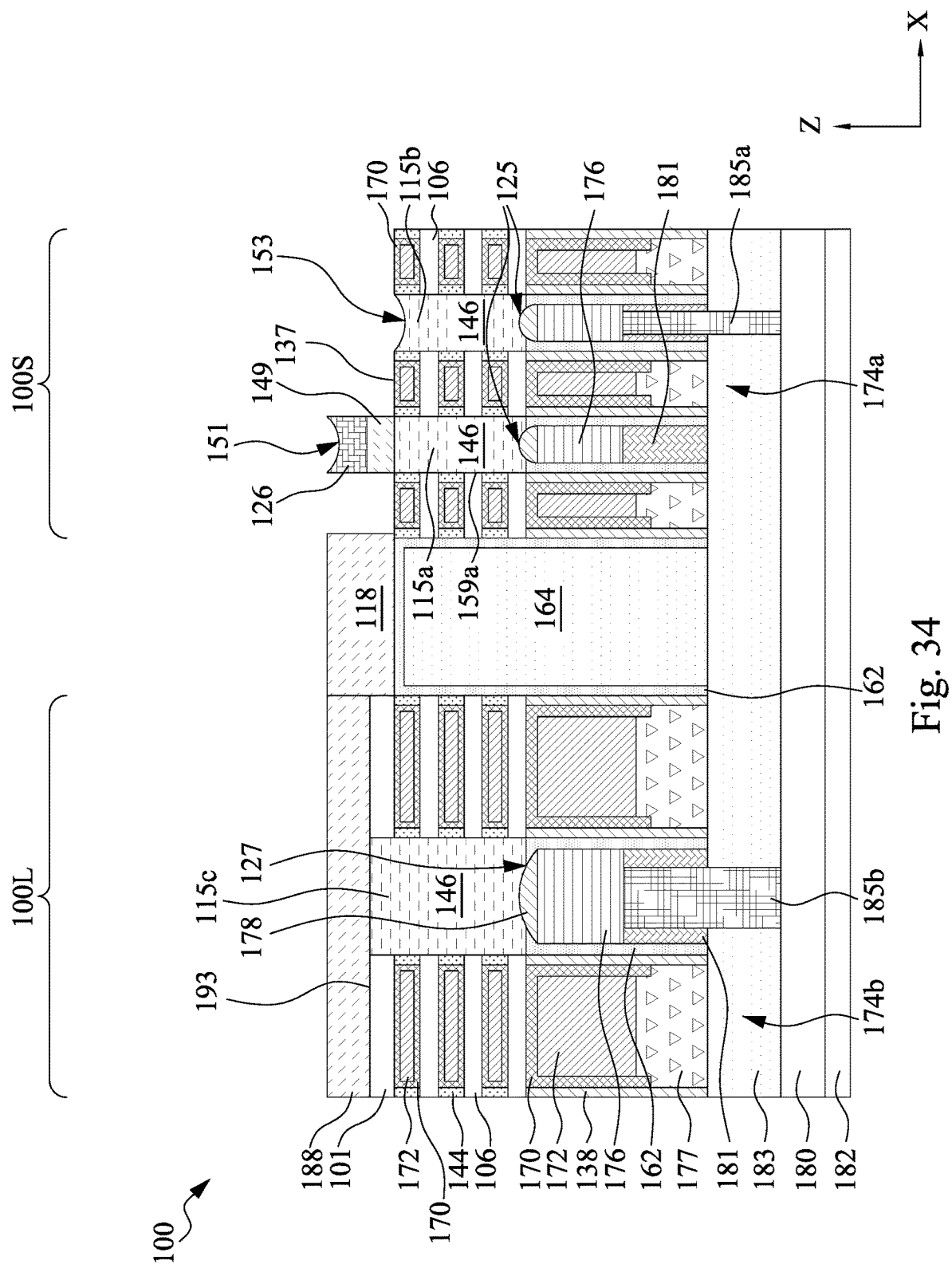

In FIG. 34, the transitional epitaxial layer 149 at the drain region 115b is removed. The transitional epitaxial layer 149 may be removed using an etchant that can selectively remove the transitional epitaxial layer 149 without substantially removing the first liner 151 and the gate dielectric layer 170. In cases where the transitional epitaxial layer 149 is SiGeB and the sacrificial layer 126 is SiGe, portions of the sacrificial layer 126 may also be removed during the removal of the transitional epitaxial layer 149. The etchant may be a wet etchant using tetramethylammonium hydroxide (TMAH) and/or potassium hydroxide (KOH) solution.

During the removal of the transitional epitaxial layer 149, the exposed surface 151 of the remaining sacrificial layer 126 and the bottom surface 153 of the exposed epitaxial S/D features 146 at the drain region 115b may be etched to have a profile. Depending on the process recipe used to remove the transitional epitaxial layer 149, the etched bottom surface 151 and the etched bottom surface 153 may have a planar profile, or a non-planar profile, such as a concave profile (dishing), or a convex profile (protruded). In the embodiment shown in FIG. 34, the etched bottom surface 151 of the remaining sacrificial layer 126 and the etched bottom surface 153 of the epitaxial S/D features 146 at the drain region 115b have a concave profile. Because the first liner 151 covers vertical sidewalls of the sacrificial layer 126 and the vertical sidewalls of the transitional epitaxial layer 149 under the sacrificial layer 126, the sacrificial layer 126 and the transitional epitaxial layer 149 under the sacrificial layer 126 can maintain their dimensions during the etch process, thus, avoiding shape degradation. After the removal of the transitional epitaxial layer 149 at the drain region 115b, the first liner 151 is removed.

Figure 35:
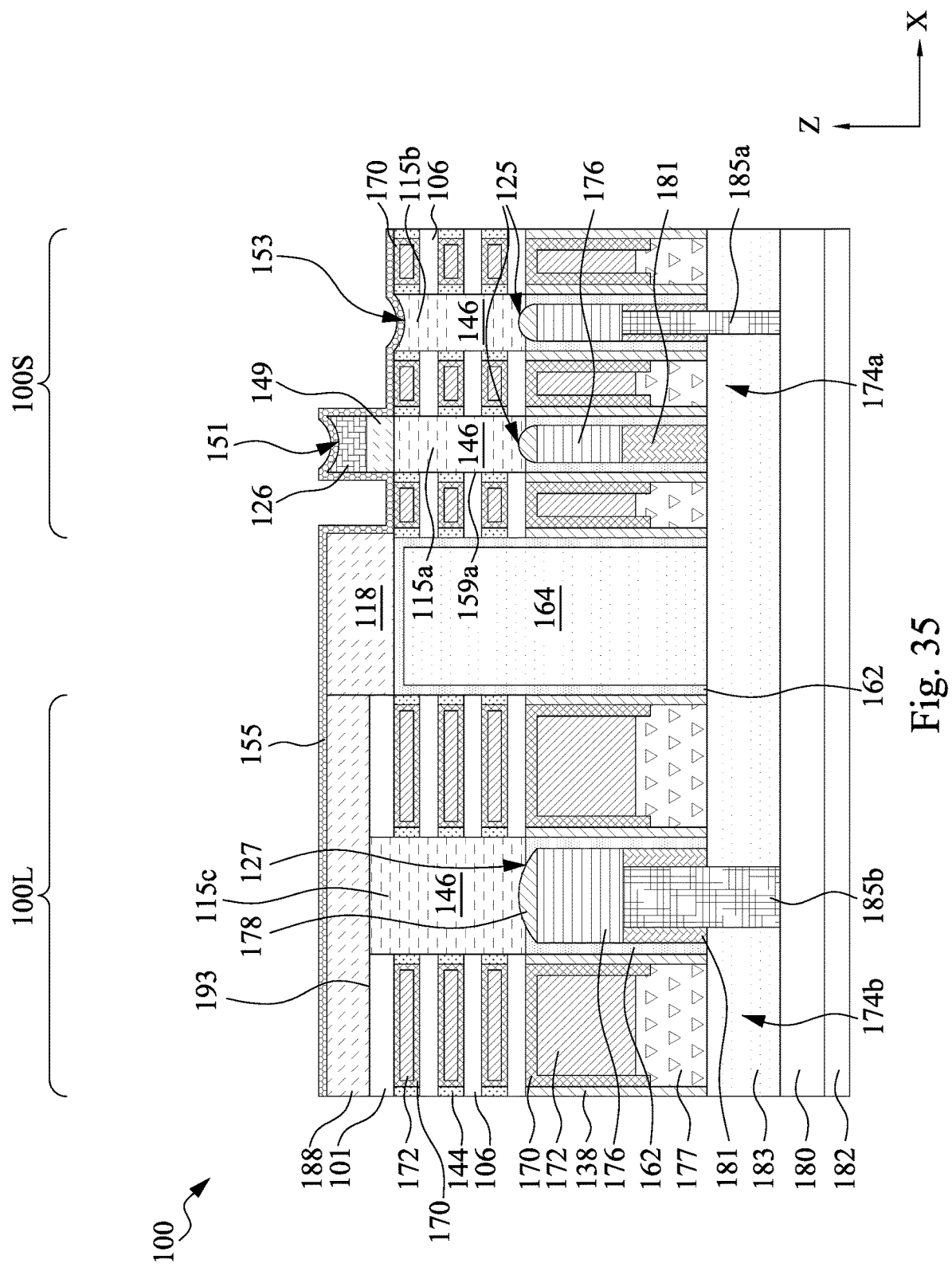

In FIG. 35, a second liner 155 is conformally formed on the backside of the semiconductor device structure 100, covering the exposed surfaces of the refill dielectric layer 188, the insulating material 118, the sacrificial layer 126, the transitional epitaxial layers 149 at the source region 115a, the gate dielectric layers 170 and the dielectric spacers 144 in the short channel region 100S. The second liner 155 may include or be made of an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique.

Figure 36:
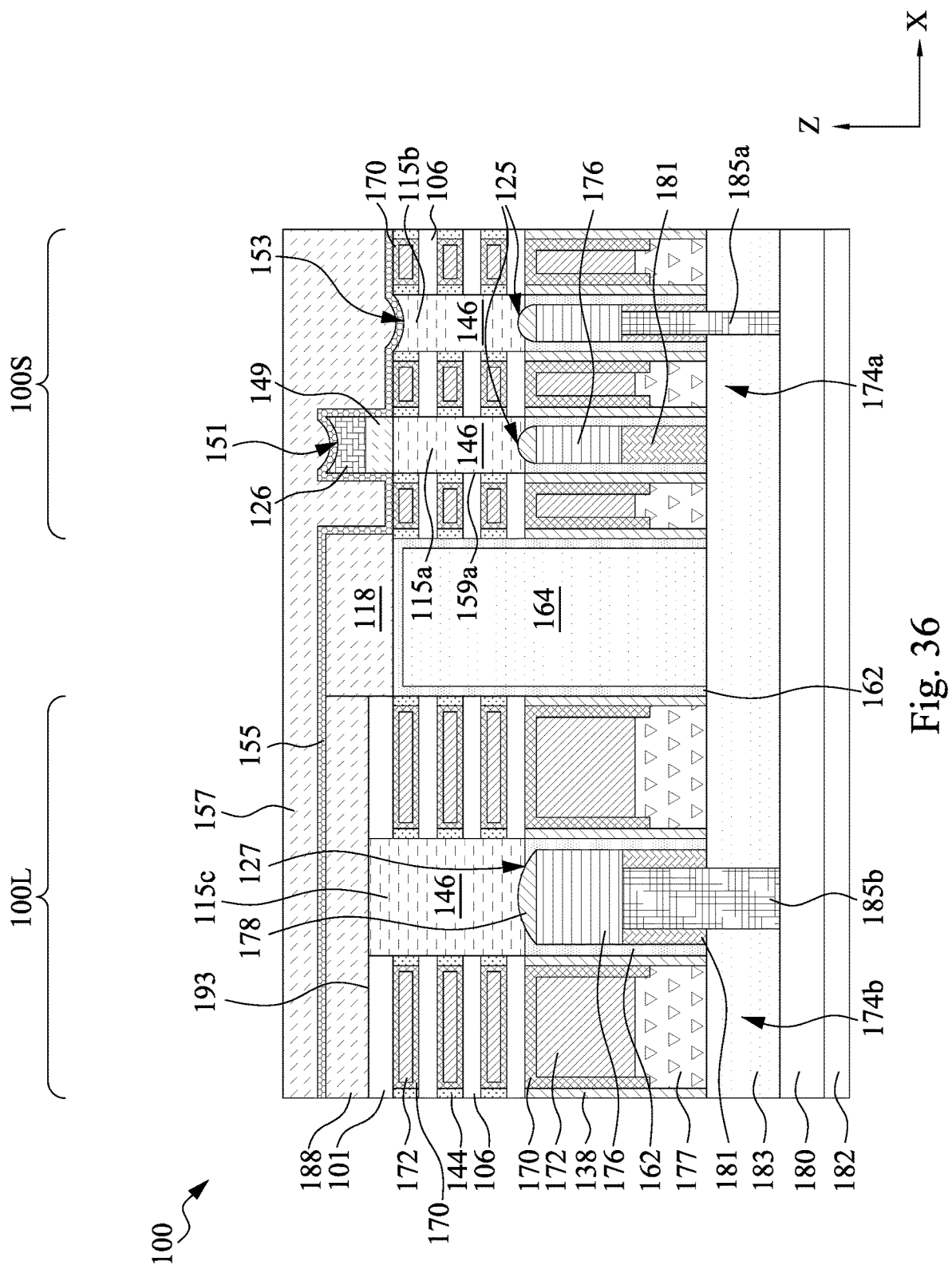

In FIG. 36, a third ILD layer 157 is formed on the backside of the semiconductor device structure 100. The third ILD layer 157 may be formed by a blanket deposition on the second liner 155. The third ILD layer 157 may be formed of the same material as the first ILD layer or the refill dielectric layer 188, and may be deposited by a PECVD process or other suitable deposition technique.

Figure 37:
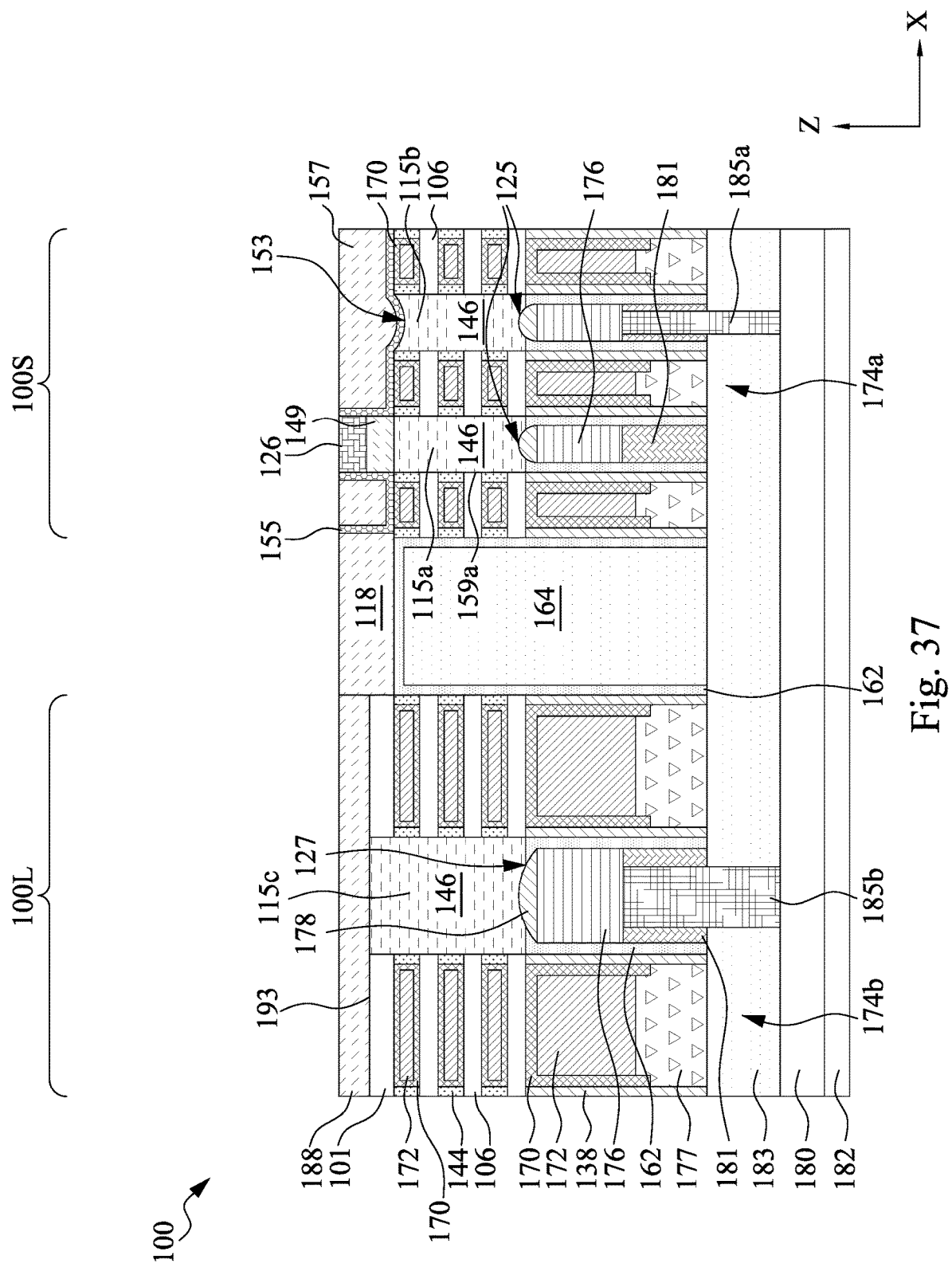

In FIG. 37, a planarization operation, such as CMP, is performed on the backside of the semiconductor device structure 100. The planarization operation is performed until the top of the sacrificial layer 126, which serves as the backside contact alignment feature, is exposed. At this stage, the top surfaces of the refill dielectric layer 188, the insulating material 118, the sacrificial layer 126, the second liner 155, and the third ILD 157 are substantially co-planar.

Figure 38:
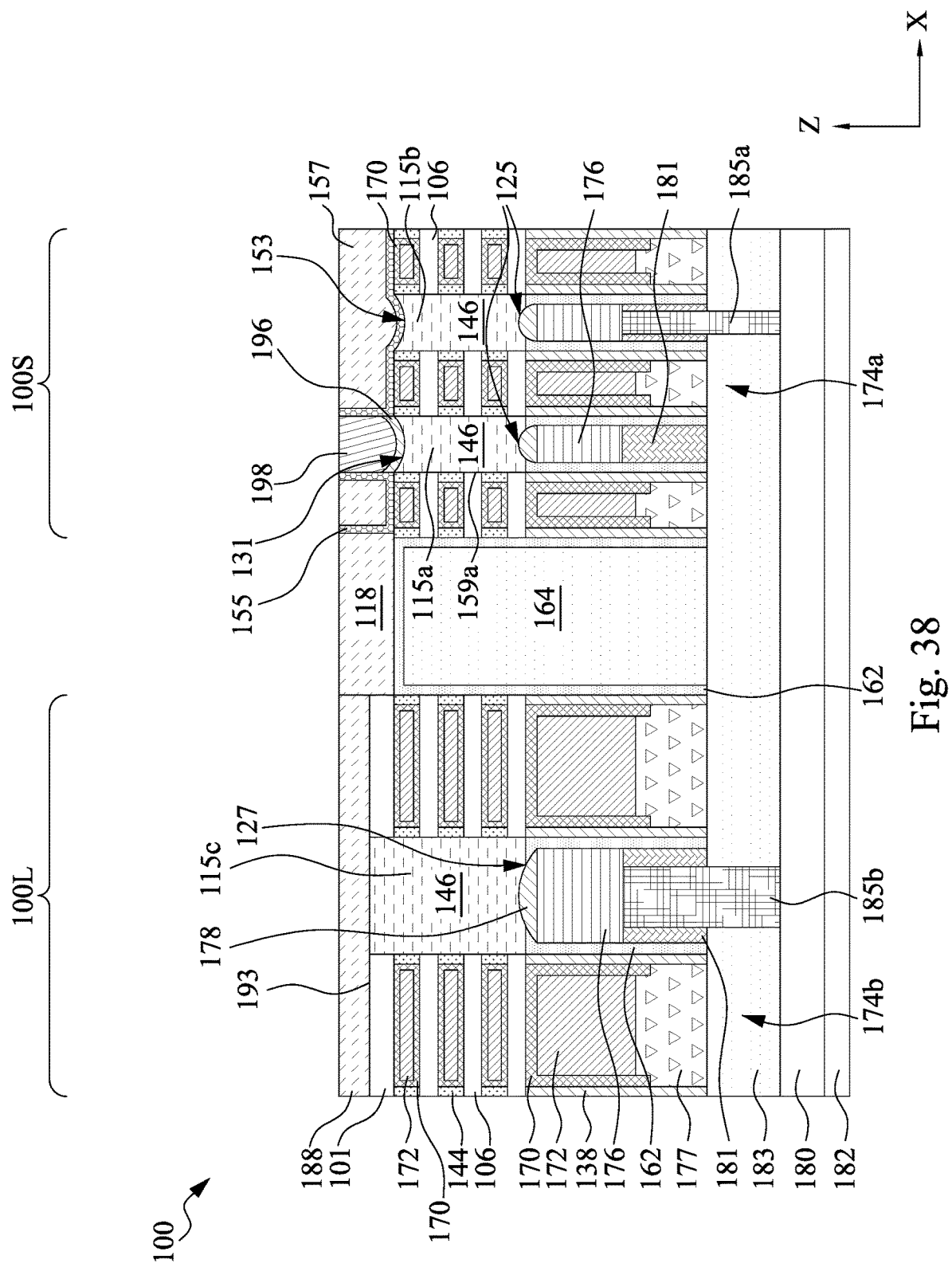

In FIG. 38, the sacrificial layer 126 and the transitional epitaxial layer 149 under the sacrificial layer 126 are removed to form contact holes and expose the epitaxial S/D features 146 underneath (e.g., the epitaxial S/D feature 146 at the source region 115a) for metal formation. During the etch process, the sacrificial layer 126 is removed to expose the transitional epitaxial layer 149. Any suitable dry and/or wet etch processes can be used to remove the sacrificial layer 126. Since the transitional epitaxial layer 149 is formed on the sacrificial layer 126, and the epitaxial S/D feature 146 is formed on the transitional epitaxial layer 149, the sacrificial layer 126 is aligned with the corresponding epitaxial S/D feature 126. Contact holes vacated by the sacrificial layer 126 are aligned with the epitaxial S/D feature 146 without using any photolithography and patterning process.

The transitional epitaxial layer 149 is then removed by a suitable etch process to expose the underlying epitaxial S/D features 146 (e.g., the epitaxial S/D feature 146 at the source region 115a). The transitional epitaxial layer 149 may be removed by a dry etch method, such as a dry etching process using fluorine-based etchant, such as $CF_4$, $NF_3$, $SF_6$, or combinations thereof. During the removal of the transitional epitaxial layer 149, the exposed bottom surface 131 of the epitaxial S/D features 146 in the short channel region 100S (e.g., epitaxial S/D feature 146 at the source region 115a) may be etched to have a profile. Depending on the process recipe used to remove the transitional epitaxial layer 149, the etched bottom surface 131 may have a planar profile, or a non-planar profile, such as a concave profile (dishing), or a convex profile (protruded). In the embodiment shown in FIG. 38, the etched bottom surface 131 of the epitaxial S/D features 146 at the source region 115a have a concave profile.

After removal of the sacrificial layer 126 and the transitional epitaxial layer 149, a silicide layer 196 is selectively formed on the exposed surface of the epitaxial S/D feature 146 (e.g., the epitaxial S/D feature 146 at the source region 115a). The silicide layer 196 may have a profile (e.g., a concave profile) according to the profile of the etched bottom surface 131 of the epitaxial S/D features 146a the source region 115a. In some embodiments, the silicide layer 196 is made of a metal or metal alloy silicide, and the metal may include a noble metal, a refractory metal, a rare earth metal, alloys thereof, or combinations thereof. Exemplary materials of the silicide layer 196 for n-channel FETs may include, but are not limited to TiSi, CrSi, TaSi, MoSi, ZrSi, HfSi, ScSi, Ysi, HoSi, TbSI, GdSi, LuSi, DySi, ErSi, YbSi, or combinations thereof. Exemplary materials of the silicide layer 196 for p-channel FETs may include, but are not limited to NiSi, CoSi, MnSi, Wsi, FeSi, RhSi, PdSi, RuSi, PtSi, IrSi, OsSi, or combinations thereof. The material for the silicide layer 196 can be different from the silicide layer 178.

Next, a backside contact feature 198 is formed in the contact holes and in contact with the silicide layer 196. The backside contact feature 198 may be made of a metal or metal nitride, such as W, Ru, Co, Cu, Ti, TiN, Ta, TaN, Mo, Ni, or combinations thereof. The backside contact feature 198 may be formed by any suitable process, such as PVD or electro-plating. The resulting backside contact feature 198 over the epitaxial S/D feature 146 (e.g., the epitaxial S/D feature 146 at the source region 115a) may have a height "H5" (FIG. 39) in a range of about 5 nm to about 50 nm. If the height "H5" is greater than about 50 nm, the contact area of the backside contact feature 198 will be increased proportionally and cause the contact resistance at the source region 115a to increase. As a result, the device performance of the transistors may be degraded. On the other hand, if the height "H5" is less than about 5 nm, the epitaxial S/D features in the long channel region 100L (e.g., epitaxial S/D features 146 at the drain region 115c) may be exposed during backside grinding of the substrate 101 in order to make a shorter backside contact feature 198 at a later stage, which in turn can damage the epitaxial S/D features in the long channel region 100L.

Figure 39:
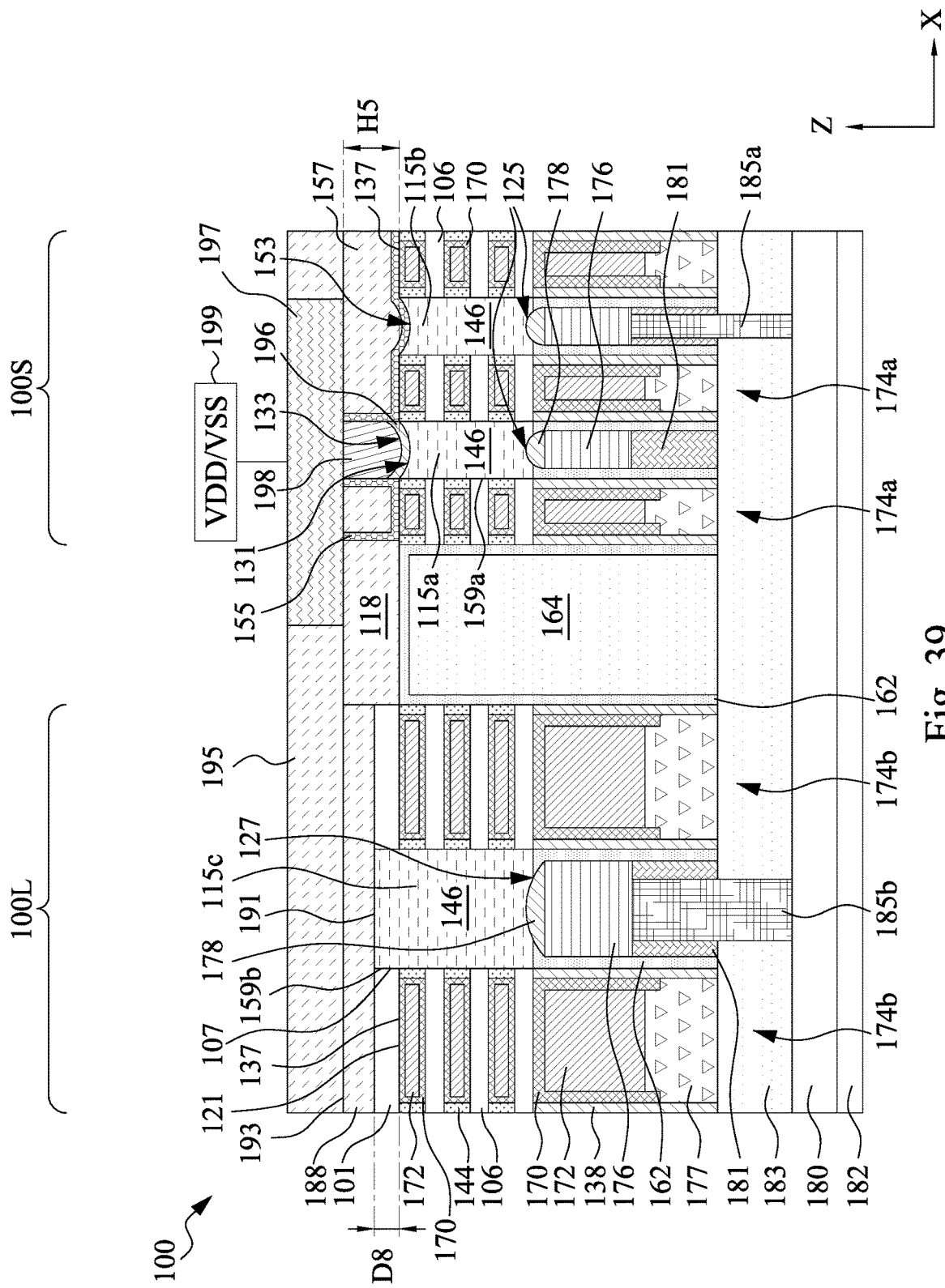

In FIG. 39, after the backside contact feature 198 is formed, a fourth ILD layer 195 is formed over the backside of the semiconductor device structure 100. One or more conductive features 197 (only one is shown) are then formed in the ILD layer 195. The conductive feature 197 is in electrical communication with the front side S/D contacts 176 through the backside contact feature 198, the silicide layer 196, the epitaxial S/D feature 146 (e.g., the epitaxial S/D feature 146 at the source region in the short channel region 100S) and the silicide layer 178. The conductive feature 197 is in connection with a power rail 199 to be connected to a power supply. In some embodiments, the conductive feature 197 is a portion of a power rail 199. Depending on the conductivity type of the device, the power supply may be fed with a positive voltage (VDD) or a negative voltage (VSS) (i.e., ground or zero voltage). Having the conductive feature 197 connected to the power rail 199 at the backside of the semiconductor device structure 100 allows for the device to be powered directly by a backside power, thereby enhancing the device performance, saving an amount of routing resources used on the front side of device, and reducing BEOL process complexity without abnormal electrical mis-connection issues.

As can be seen in FIG. 39, the bottom surface 153 of the epitaxial S/D feature 146 (e.g., epitaxial S/D feature 146 at the drain region 115b) in the short channel region 100S is above the bottom surface 137 (which and a surface 121 of the substrate 101 in contact with the bottom surface 137 are co-planar) of the gate dielectric layer 170 due to the concave profile of the etched bottom surface 153, and the bottom surface 191 of the epitaxial S/D feature 146 (e.g., epitaxial S/D feature 146 at drain region 115c) in the long channel region 100L is at a distance "D8" below or beyond the bottom surface 137 of the gate dielectric layer 170. In some embodiments, the distance 'D8" may vary in a range from about 1 nm to about 40 nm. If the distance "D8" is greater than 40 nm, the backside contact feature 198 will have to be made longer in order to compensate for the depth of the epitaxial S/D features 146 (e.g., epitaxial S/D features 146 at the drain region 115c) so that the epitaxial S/D features 146 in the long channel region 100L (e.g., epitaxial S/D features 146 at the drain region 115c) are not exposed during the backside grinding of the substrate 101. The longer backside contact feature 198 can cause the contact resistance at source region 115a to increase. As a result, the device performance of the transistors is degraded.

Since the epitaxial S/D features 146 in the long channel region 100L (e.g., epitaxial S/D features 146 at the drain region 115c) is recessed during backside grinding of the substrate 101, the backside contact feature 198 in the short channel region 100S (e.g., backside contact feature 198 over the source region 115a) can be made shorter, thereby reducing the contact resistance at the source region 115a. The capacitance between the source/drain regions and the gate electrode in the short channel regions can also be reduced. As a result, the device performance of the transistors is improved.

Figure 40:
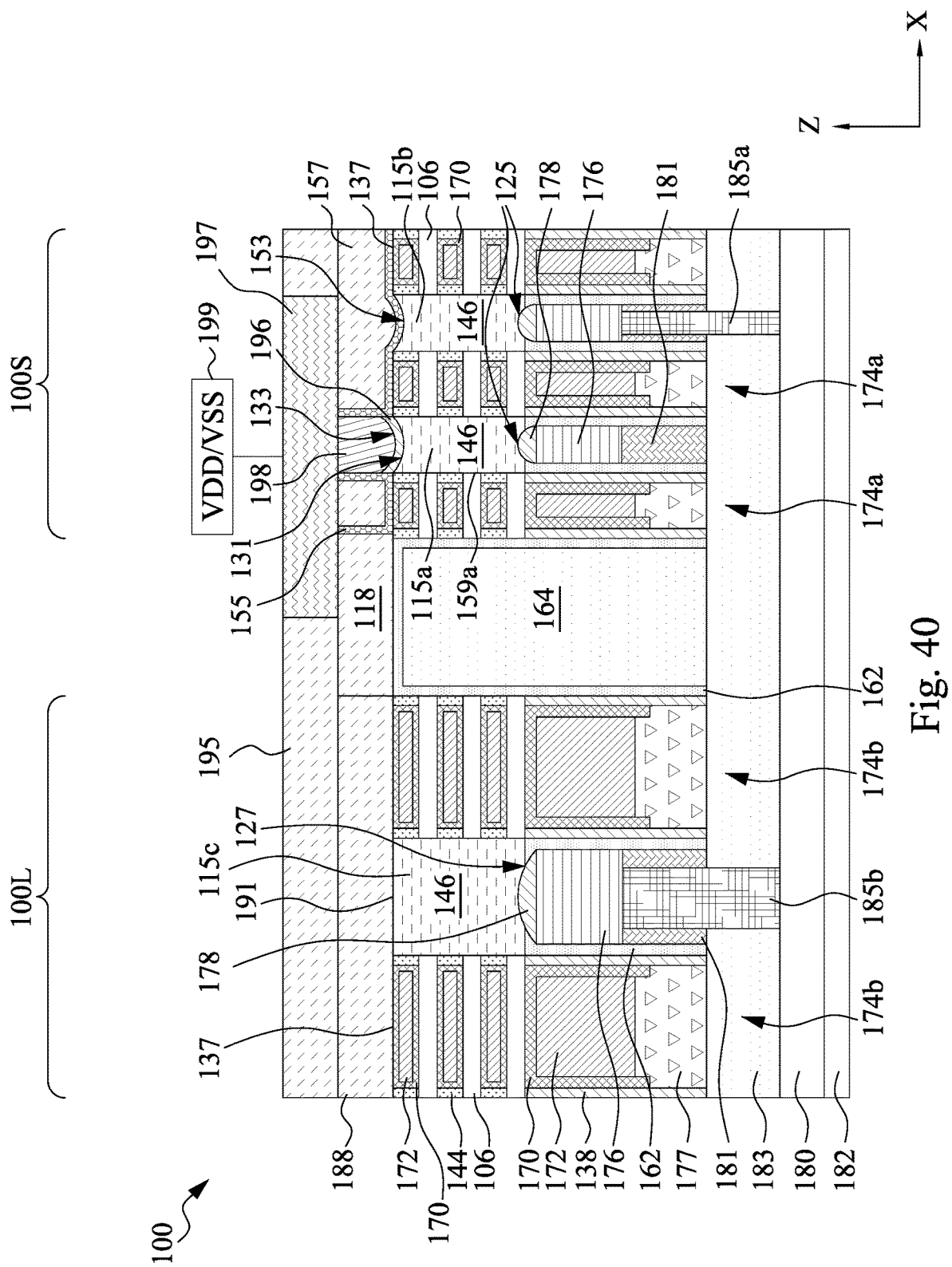

FIG. 40 illustrates a cross-sectional view of the semiconductor device structure 100 based on the alternative embodiment shown in FIG. 27. The semiconductor device structure 100 has the backside contact feature 198 and the epitaxial S/D feature 146 formed at the source region 115a according to the processes discussed in FIGS. 29-40. In this embodiment, the epitaxial S/D features 146 in the long channel region 100L (e.g., epitaxial S/D features 146 at the drain region 115c) is recessed to the level so that the bottom surface 191' of the epitaxial S/D features 146 is substantially co-planar with the bottom surface 137 of the gate dielectric layer 170. In this manner, the backside contact feature 198 in the short channel region 100S (e.g., backside contact feature 198 over the source region 115a) can be made shorter, thereby reducing the contact resistance at the source region 115a. As a result, the device performance of the transistors in the short channel regions is improved.

FIG. 41 illustrates a cross-sectional view of the semiconductor device structure 100 based on the alternative embodiment shown in FIG. 28. The semiconductor device structure 100 has the backside contact feature 198 and the epitaxial S/D feature 146 formed at the source region 115a according to the processes discussed in FIGS. 29-40. In this embodiment, the substrate 101 in the long channel region 101 is completely removed so that the sidewall 159b of the epitaxial S/D feature 146 in the long channel region 100L (e.g., epitaxial S/D features 146 at the drain region 115c) is in contact with the refill dielectric layer 188. The bottom surface 131 of the epitaxial S/D features 146 in the short channel region 100S (e.g., epitaxial S/D feature 146 at the source region 115a) is above the bottom surface 137 of the gate dielectric layer 170, and the bottom surface 191 of the epitaxial S/D feature 146 in the long channel region 100L (e.g., epitaxial S/D features 146 at the drain region 115c) is at a distance "D10" below or beyond the bottom surface 137 of the gate dielectric layer 170.

In some embodiments, the bottom surface 133 of the backside contact feature 198 in the short channel region 100S (e.g., backside contact feature 198 over the source region 115a) is at a distance "D9" below or beyond the bottom surface 137 of the gate dielectric layer 170. In some embodiments, the distance 'D10" may vary in a range from about 1 nm to about 40 nm. The distance "D9" and "D10" can be chosen similarly to the height "H5" and distance "D8" discussed above in FIG. 39.

Embodiments of the present disclosure provide a semiconductor device structure including devices, such as nanosheet transistors, formed in short channel regions and long channel regions. Epitaxial S/D features at drain regions of the long channel regions are recessed to allow formation of shorter backside contact features at source regions of the short channel regions. When the backside contact features are shorter, the contact surface of the backside contact features is reduced proportionally, resulting in lower contact resistance at source epitaxial features of the short channel regions, lower capacitance between the source/drain regions and the gate electrode in the short channel regions, and better device performance of the transistors.

An embodiment is a semiconductor device structure. The structure includes a source/drain feature comprising a first surface, a second surface opposing the first surface, and a sidewall connecting the first surface to the second surface. The structure also includes a dielectric layer in contact with the second surface of the source/drain feature. The structure also includes a semiconductor layer having a first surface, a second surface opposing the first surface, and a sidewall connecting the first surface to the second surface, wherein the sidewall of the semiconductor layer is in contact with the sidewall of the source/drain feature, and the second surface of the semiconductor layer is co-planar with the second surface of the source/drain feature. The structure further includes a gate structure having a surface in contact with the first surface of the semiconductor layer.

Another embodiment is a semiconductor device structure. The structure includes a first source/drain feature disposed in a first region of the semiconductor device structure, wherein the first source/drain feature comprises a first surface, a second surface opposing the first surface, and a sidewall connecting the first surface to the second surface. The structure also includes a first gate structure disposed in the first region of the semiconductor device structure, wherein the first gate structure comprises a first gate dielectric layer, and the gate dielectric layer has a first surface. The structure also includes a first silicide layer in contact with the second surface of the first source/drain feature. The structure also includes a contact feature having a first surface in contact with the first silicide layer. The structure also includes a second source/drain feature disposed in a second region of the semiconductor device structure, wherein the second source/drain feature comprises a first surface, a second surface opposing the first surface of the second source/drain feature, and a sidewall connecting the first surface of the second source/drain feature and the second surface of the second source/drain feature. The structure also includes a second gate structure disposed in the second region of the semiconductor device structure, wherein the second gate structure comprises a second gate dielectric layer, and the second gate dielectric layer has a first surface that is co-planar with the first surface of the first gate dielectric layer. The structure further includes a first dielectric layer disposed in the second region of the semiconductor device structure, wherein the first dielectric layer is in contact with the second surface of the second source/drain feature, and wherein the second surface of the second source/drain feature is below the first surface of the second gate dielectric layer, and the second surface of the first source/drain feature is above the first surface of the first gate dielectric layer.

A further embodiment is a method for forming a semiconductor device structure. The method includes forming a first trench in a first region of a substrate, the first trench extending a first depth into the substrate. The method also includes forming a second trench in a second region of the substrate, the second trench extending a second depth into the substrate, and the first depth is greater than the second depth. The method also includes forming a sacrificial layer at a bottom of the first trench. The method also includes forming a first epitaxial layer on the sacrificial layer. The method also includes forming a second epitaxial layer at a bottom of the second trench. The method also includes forming a first source/drain feature on the first epitaxial layer. The method also includes forming a second source/drain feature on the second epitaxial layer. The method also includes flipping the substrate. The method also includes removing a portion of the substrate until the second epitaxial layer in the second trench and the sacrificial layer in the first trench are exposed. The method also includes covering the first region by a patterned protective layer. The method further includes removing the second epitaxial layer, at least a portion of the substrate, and a portion of the second source/drain feature in the second region so that a bottom surface of the substrate in the second region and a bottom surface of the second source/drain feature are co-planar, wherein the bottom surface of the second source/drain feature is at a first level and a bottom surface of the sacrificial layer is at a second level, and the first level is different than the second level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a source/drain feature comprising a first surface, a second surface opposing the first surface, and a sidewall connecting the first surface to the second surface;
   a dielectric layer having a first surface and a second surface opposing the first surface, the first surface being a continuous surface in contact with the second surface of the source/drain feature, and the second surface of the dielectric layer being in contact with an interlayer dielectric;
   a semiconductor layer having a first surface, a second surface opposing the first surface, and a sidewall connecting the first surface to the second surface, wherein the sidewall of the semiconductor layer is in contact with the sidewall of the source/drain feature;
   a gate dielectric layer in contact with the continuous surface of the dielectric layer and the second surface of the semiconductor layer; and
   a gate electrode layer surrounding a portion of the semiconductor layer.

2. The semiconductor device structure of claim 1, wherein the first surface of the source/drain feature has a concave profile.

3. The semiconductor device structure of claim 1, further comprising:
   a dielectric spacer, comprising:
      a first surface in contact with the continuous surface of the dielectric layer;
      a second surface opposite the first surface of the dielectric spacer and in contact with the second surface of the semiconductor layer;
      a third surface in contact with the gate dielectric layer; and
      a fourth surface in contact with the sidewall of the source/drain feature.

4. The semiconductor device structure of claim 3, wherein the first surface of the dielectric spacer, the second surface of the source/drain feature, and a surface of the gate dielectric layer are substantially co-planar.

5. The semiconductor device structure of claim 1, further comprising:
   a silicide layer in contact with the first surface of the source/drain feature;
   a source/drain contact in contact with the silicide layer;
   a dielectric cap in contact with the source/drain contact; and
   a conductive feature extending through the dielectric cap layer and in contact with the source/drain contact.

6. A semiconductor device structure, comprising:
   a first source/drain feature disposed in a first region of the semiconductor device structure, wherein the first source/drain feature comprises a first surface, a second surface opposing the first surface, and a sidewall connecting the first surface to the second surface;
   a first dielectric layer having a first surface and a second surface opposing the first surface, the first surface being a continuous surface in contact with the entire second surface of the first source/drain feature, and the second surface being in contact with an interlayer dielectric;
   a first semiconductor layer disposed in the first region of the semiconductor device structure and in contact with the first source/drain feature;
   a first gate dielectric layer disposed between and in contact with the continuous surface of the first dielectric layer and the first semiconductor layer;
   a first gate electrode layer surrounding a portion of the first semiconductor layer;
   a second source/drain feature disposed in a second region of the semiconductor device structure, wherein the second source/drain feature comprises a first surface, a second surface opposing the first surface of the second source/drain feature, and a sidewall connecting the first surface to the second surface of the second source/drain feature;
   a second dielectric layer disposed in the second region of the semiconductor device structure; and
   a second semiconductor layer disposed in the second region of the semiconductor device structure and in contact with the second source/drain feature.

7. The semiconductor device structure of claim 6, wherein the second surface of the first source/drain feature is planar, and the second surface of the second source/drain feature is curved.

8. The semiconductor device structure of claim 6, further comprising:
   a second gate dielectric layer disposed between the second dielectric layer and the second semiconductor layer; and
   a liner layer disposed between and in contact with the second gate dielectric layer and the second dielectric layer.

9. The semiconductor device structure of claim 8, wherein the liner layer is further in contact with the second surface of the second source/drain feature.

10. The semiconductor device structure of claim 8, wherein the liner layer comprises a material that is chemically different than that a material of the second dielectric layer.

11. The semiconductor device structure of claim 9, further comprising:
    a first silicide layer in contact with the first surface of the first source/drain feature;
    a first source/drain contact in contact with the first silicide layer;
    a first dielectric cap in contact with the first source/drain contact; and
    a first conductive feature extending through the first dielectric cap layer and in contact with the first source/drain contact.

12. The semiconductor device structure of claim 11, further comprising:
    a second silicide layer in contact with the first surface of the second source/drain feature;
    a second source/drain contact in contact with the second silicide layer;
    a second dielectric cap in contact with the second source/drain contact; and
    a second conductive feature extending through the second dielectric cap layer and in contact with the second source/drain contact.

13. The semiconductor device structure of claim 8, further comprising:
    a first dielectric spacer, comprising:
       a first surface in contact with the first semiconductor layer;

a second surface opposite the first surface of the first dielectric spacer and in contact with the continuous surface of the first dielectric layer;

a third surface in contact with the first gate dielectric layer; and a fourth surface in contact with the sidewall of the first source/drain feature.

14. The semiconductor device structure of claim 13, wherein the second surface of the first dielectric spacer, the second surface of the first source/drain feature, and a surface of the first gate dielectric layer are substantially co-planar.

15. The semiconductor device structure of claim 13, further comprising:

a second dielectric spacer, comprising:

a first surface in contact with the second semiconductor layer;

a second surface opposite the first surface of the second dielectric spacer and in contact with the liner layer;

a third surface in contact with the second gate dielectric layer; and a fourth surface in contact with the sidewall of the second source/drain feature.

16. A semiconductor device structure, comprising:

a first dielectric layer disposed in a first region of the semiconductor device structure, the first dielectric layer having a first surface and a second surface, wherein the second surface is in contact with an interlayer dielectric;

a first source/drain feature disposed in the first region of the semiconductor device structure, wherein the first source/drain feature comprises a first surface, a second surface opposing the first surface, and a sidewall connecting the first surface to the second surface, wherein the first source/drain feature extends a distance into the first surface of the first dielectric layer;

a first semiconductor layer disposed in the first region of the semiconductor device structure and in contact with the first source/drain feature;

a first gate dielectric layer disposed between and in contact with the first dielectric layer and the first semiconductor layer, wherein the first gate dielectric layer and the first semiconductor layer define an interface that is at an elevation different than an elevation of the second surface of the first source/drain feature; and a first gate electrode layer surrounding a portion of the first semiconductor layer.

17. The semiconductor device structure of claim 16, further comprising:

a second source/drain feature disposed in a second region of the semiconductor device structure, wherein the second source/drain feature comprises a first surface, a second surface opposing the first surface of the second source/drain feature, and a sidewall connecting the first surface to the second surface of the second source/drain feature, wherein the second surface of the second source/drain feature is at an elevation different than the elevation of the second surface of the first source/drain feature; and a second semiconductor layer disposed in the second region of the semiconductor device structure and in contact with the second source/drain feature.

18. The semiconductor device structure of claim 17, further comprising:

a second dielectric layer disposed in the second region of the semiconductor device structure; and a liner layer disposed between and in contact with the second surface of the second source/drain feature and the second dielectric layer, wherein the liner layer comprises a material that is chemically different than that of the second dielectric layer.

19. The semiconductor device structure of claim 18, further comprising:

a second gate dielectric layer disposed between the second dielectric layer and the second semiconductor layer, wherein the liner layer is further in contact with the second gate dielectric layer.

20. The semiconductor device structure of claim 17, wherein the second surface of the first source/drain feature is planar, and the second surface of the second source/drain feature is curved.

* * * * *